(12) United States Patent
Ootsuka et al.

(10) Patent No.: US 11,961,861 B2
(45) Date of Patent: *Apr. 16, 2024

(54) IMAGE PICKUP ELEMENT, IMAGE PICKUP DEVICE, MANUFACTURING DEVICE AND METHOD

(71) Applicant: Sony Group Corporation, Tokyo (JP)

(72) Inventors: Yoichi Ootsuka, Kumamoto (JP); Atsushi Yamamoto, Kumamoto (JP); Kensaku Maeda, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/127,811

(22) Filed: Mar. 29, 2023

(65) Prior Publication Data

US 2023/0238415 A1 Jul. 27, 2023

Related U.S. Application Data

(63) Continuation of application No. 17/741,387, filed on May 10, 2022, now Pat. No. 11,646,339, which is a
(Continued)

(30) Foreign Application Priority Data

May 30, 2012 (JP) .................................. 2012-122851
Oct. 29, 2012 (JP) .................................. 2012-237371

(51) Int. Cl.
*H01L 27/146* (2006.01)
*G02B 1/11* (2015.01)
(Continued)

(52) U.S. Cl.
CPC .......... *H01L 27/14627* (2013.01); *G02B 1/11* (2013.01); *G02B 3/0056* (2013.01);
(Continued)

(58) Field of Classification Search
CPC . H01L 27/146–14893; H01L 27/14621; H01L 27/14627; H01L 27/14685;
(Continued)

(56) References Cited

U.S. PATENT DOCUMENTS 5,824,236 A 10/1998 Hawkins
6,583,438 B1 6/2003 Uchida
(Continued)

FOREIGN PATENT DOCUMENTS

CN 1825608 A 8/2006
CN 102446937 A 5/2012
(Continued)

OTHER PUBLICATIONS

International Search Report; International Application No. PCT/JP2013/064222; Filed: May 22, 2013 (Form PCT/ISA/210).
(Continued)

*Primary Examiner* — Lin Ye
*Assistant Examiner* — Chriss S Yoder, III
(74) *Attorney, Agent, or Firm* — Michael Best & Friedrich LLP

(57) ABSTRACT

There is provided an image pickup element including a non-planar layer having a non-planar light incident surface in a light receiving region, and a microlens of an inorganic material which is provided on a side of the light incident surface of the non-planar layer, and collects incident light.

17 Claims, 35 Drawing Sheets

Related U.S. Application Data continuation of application No. 16/592,081, filed on Oct. 3, 2019, now Pat. No. 11,411,031, which is a continuation of application No. 14/398,257, filed as application No. PCT/JP2013/064222 on May 22, 2013, now Pat. No. 10,461,107.

(51) Int. Cl.
*G02B 3/00* (2006.01)
*G02B 5/20* (2006.01)

(52) U.S. Cl.
CPC ......... *G02B 3/0062* (2013.01); *G02B 3/0068* (2013.01); *G02B 5/201* (2013.01); *H01L 27/14621* (2013.01); *H01L 27/14685* (2013.01)

(58) Field of Classification Search
CPC ...... G02B 1/11; G02B 3/0056; G02B 3/0062; G02B 3/0068; G02B 5/201
See application file for complete search history.

(56) References Cited

U.S. PATENT DOCUMENTS

| | | |
|---|---|---|
| 6,610,219 B2 | 8/2003 | McGinniss et al. |
| 6,614,479 B1 | 9/2003 | Fukusho et al. |
| 7,932,948 B2 | 4/2011 | Higuchi et al. |
| 8,119,437 B2 | 2/2012 | Kim et al. |
| 9,093,577 B2 | 7/2015 | Sasaki |
| 9,231,013 B2 | 1/2016 | Lenchenkov |
| 10,240,033 B2 | 3/2019 | Nimura et al. |
| 2003/0040559 A1 | 2/2003 | Hashimoto et al. |
| 2004/0012707 A1 | 1/2004 | Fukusho et al. |
| 2006/0076636 A1 | 4/2006 | Fukunaga |
| 2008/0049126 A1 | 2/2008 | Ford et al. |
| 2009/0059055 A1 | 3/2009 | Nakano et al. |
| 2009/0302408 A1 | 12/2009 | Nakagawa et al. |
| 2009/0316028 A1 | 12/2009 | Liu |
| 2012/0086093 A1 | 4/2012 | Otsuka et al. |
| 2012/0153271 A1 | 6/2012 | Goto et al. |
| 2016/0027848 A1 | 1/2016 | Liu et al. |

FOREIGN PATENT DOCUMENTS

| | | |
|---|---|---|
| JP | 11-103037 A | 4/1999 |
| JP | 2002314058 A | 10/2002 |
| JP | 2003051588 A | 2/2003 |
| JP | 2005-142468 A | 6/2005 |
| JP | 2006-121065 A | 5/2006 |
| JP | 2007-048967 A | 2/2007 |
| JP | 2008-009079 | 1/2008 |
| JP | 2008-159748 A | 7/2008 |
| JP | 2008-277800 | 11/2008 |
| JP | 2009-064839 A | 3/2009 |
| JP | 2011109033 A | 6/2011 |
| JP | 2011-258728 A | 12/2011 |
| JP | 2012-009539 A | 1/2012 |
| JP | 2012-084608 A | 4/2012 |
| KR | 20120052856 A | 5/2012 |

OTHER PUBLICATIONS

Written Opinion of the International Searching Authority; International Application No. PCT/JP2013/064222: dated: Jun. 18, 2013. (Form PCT/ISA/220 and PCT/ISA/237).

Korean Patent Office Notification of Reason for Refusal dated Jul. 9, 2019 for corresponding Korean Application No. 10-2014-7031842.

Korean Office Action dated Mar. 3, 2021 for corresponding Korean Application No. 10-2020-7036116.

FIG. 9

|  | ① | ② | ③ |
|---|---|---|---|
| FIRST MICROLENS | SiON | SiN | SiN |
| SECOND MICROLENS | SiON | SiON | SiN |

FIG. 10

|                  | ①    | ②    | ③   | ④   |
|------------------|------|------|-----|-----|
| FIRST MICROLENS  | SiON | SiON | SiN | SiN |
| SECOND MICROLENS | SiON | SiON | SiN | SiN |
| THIRD MICROLENS  | SiON | SiO  | SiN | SiO |

FIG. 11

|  | ① | ② |
|---|---|---|
| FIRST MICROLENS | SiON | SiN |
| SECOND MICROLENS | SiON | SiN |
| THIRD MICROLENS | (d) | (d) |
| FOURTH MICROLENS | (e) | (e) |

FIG. 12

|  | ① | ② |
|---|---|---|
| FIRST MICROLENS | ORGANIC MICROLENS | |
| SECOND MICROLENS | SiON | SiN |

FIG. 13

|  | ① | ② | ③ | ④ |
|---|---|---|---|---|
| FIRST MICROLENS | ORGANIC MICROLENS | | | |
| SECOND MICROLENS | SiON | SiON | SiN | SiN |
| THIRD MICROLENS | SiON | SiO | SiN | SiON |

FIG. 14

|  | ① | ② |
|---|---|---|
| FIRST MICROLENS | ORGANIC MICROLENS | |
| SECOND MICROLENS | SiON | SiN |
| THIRD MICROLENS | (d) | (d) |
| FOURTH MICROLENS | (e) | (e) |

IMAGE PICKUP ELEMENT, IMAGE PICKUP DEVICE, MANUFACTURING DEVICE AND METHOD

TECHNICAL FIELD

The present technology relates to image pickup elements, image pickup devices, manufacturing devices and methods, and more particularly, to an image pickup element, image pickup device, manufacturing device and method which can reduce deterioration of sensitivity characteristics.

BACKGROUND ART

Conventionally, a solid-state image pickup device, which includes a large number of image pickup regions, and an optical element having microlenses etc., on a semiconductor wafer, is hermetically molded after electrical interconnects have been formed, and is used as a photosensor for digital video equipment, such as a digital still camera, a camera for a mobile telephone, a digital camcorder, etc.

Various methods have been proposed as a method for manufacturing such a solid-state image pickup device (see, for example, Patent Literature 1 and Patent Literature 2).

Patent Literature 1 discloses a method for manufacturing a microlens in which a gap between each microlens made of inorganic film is reduced, and a distance from a photodiode to the microlens is reduced, thereby improving sensitivity characteristics of a solid-state image pickup element.

Patent Literature 2 discloses a method for manufacturing a microlens including two layers.

CITATION LIST

Patent Literature

Patent Literature 1: JP 2008-009079A
Patent Literature 2: JP 2008-277800A

SUMMARY OF INVENTION

Technical Problem

However, in the case of the method described in Patent Literature 1, a middle layer is also used to transfer its shape to a lens material layer by etching, and therefore, it takes a longer time to perform the etching. This etching process is performed by plasma etching, and therefore, the plasma damage adversely affects the solid-state image pickup device. Specifically, dark-current characteristics etc. of the solid-state image pickup element deteriorate due to the longer etching time. At the same time, the long processing time increases variations in etching on a semiconductor wafer substrate surface or between wafer substrates, which causes variations in the position in the cross-sectional direction of the microlens, leading to the risk of reduction of the sensitivity characteristics of the solid-state image pickup element.

The microlens with high light collection power which is formed by the method described in Patent Literature 2 is a gapless microlens which is formed by adjusting the film formation of the microlens in the second layer so that there is not a gap between each microlens. However, when the micro in the second layer is formed so that a gap of the microlens in the first layer having a gap is reduced, the position of the microlens which is finally formed is raised (further away from the photodiode surface), and therefore, it is likely that the sensitivity characteristics etc. of a solid-state image pickup device in which the distance between the photodiode and the microlens is reduced as in, for example, a back-illuminated solid-state image pickup device, cannot be improved.

With these circumstances in mind, the present technology has been proposed, and it is an object of the present technology to reduce the deterioration of the sensitivity characteristics.

Solution to Problem

According to a first aspect of the present technology, there is provided an image pickup element including a non-planar layer having a non-planar light incident surface in a light receiving region, and a microlens of an inorganic material which is provided on a side of the light incident surface of the non-planar layer, and collects incident light.

The microlens may include a plurality of layers.

The layers of the microlens including the plurality of layers may have different refractive indices.

The layers of the microlens including the plurality of layers may have different curved surface shapes.

At least a portion of the layers of the microlens including the plurality of layers may be formed in a recess portion of the non-planar layer.

An anti-reflection film may be formed over a light incident surface of the microlens.

An adhesive material layer provided on a side of a light incident surface of the microlens may be further included.

The non-planar layer may have a filter.

The filter may include filters with a plurality of colors having different thicknesses in a direction in which light passes.

In the filter, filters having different thicknesses and corresponding to red, green, and blue pixels, may be arranged in a Bayer arrangement, and the green filters may be linked between pixels.

The filter may be formed of an organic material.

The non-planar layer may have an organic film which is formed on the filter and has a non-planar light incident surface.

Heights of projections and recesses of a light incident surface of the organic film may be lower than heights of projections and recesses of a light incident surface of the filter.

The refractive index of the organic film may be between the refractive index of the filter and the refractive index of the microlens.

The non-planar layer may have an inter-pixel light shield film.

The non-planar layer may have projections and recesses on the light incident surface due to a difference in height between the filter and the inter-pixel light shield film.

A chip size package structure may be formed.

According to a second aspect of the present technology, there is provided an image pickup device including an image pickup element which captures an image of an object, and outputs the image of the object as an electrical signal, and an image processing unit which processes the image of the object obtained by the image pickup element. The image pickup element includes a non-planar layer which has a non-planar light incident surface in a light receiving region, and a microlens of an inorganic material which is provided on a side of the light incident surface of the non-planar layer, and collects incident light.

According to a third embodiment of the present technology, there is provided a manufacturing device including a non-planar layer forming unit which forms a non-planar layer having a non-planar light incident surface in a light receiving region of an image pickup element, an inorganic film forming unit which forms an inorganic film on a side of the light incident surface of the non-planar layer formed by the non-planar layer forming unit, a planarization film forming unit which forms a planarization film on a side of a light incident surface of the inorganic film formed by the inorganic film forming unit, a resist forming unit which forms a resist on a side of a light incident surface of the planarization film formed by the planarization film forming unit, a thermal reflow process unit which performs a thermal reflow process on the image pickup element on which the resist has been formed by the resist forming unit, and an etching process unit which performs etching on the image pickup element on which the thermal reflow process has been performed by the thermal reflow process unit.

According to the third embodiment of the present disclosure, there is further provided a method for manufacturing a manufacturing device which manufactures an image pickup element, the method including by the manufacturing device, forming a non-planar layer having a non-planar light incident surface in a light receiving region of an image pickup element, forming an inorganic film on a side of the light incident surface of the non-planar layer formed, forming a planarization film on a side of a light incident surface of the inorganic film formed, forming a resist on a side of a light incident surface of the planarization film formed, performing a thermal reflow process on the image pickup element on which the resist has been formed, and performing etching on the image pickup element on which the thermal reflow process has been performed.

According to the first aspect of the present technology, a non-planar layer having a non-planar light incident surface in a light receiving region, and a microlens of an inorganic material which is provided on the light incident surface of the non-planar layer, and collects incident light, are included.

According to the second aspect of the present technology, an image pickup element which captures an image of an object, and outputs the image of the object as an electrical signal, and an image processing unit which processes the image of the object obtained by the image pickup element, are included. The image pickup element includes a non-planar layer which has a non-planar light incident surface in a light receiving region, and a microlens of an inorganic material which is provided on the light incident surface of the non-planar layer, and collects incident light.

According to the third aspect of the present technology, a non-planar layer is formed which has a non-planar light incident surface in a light receiving region of an image pickup element, an inorganic film is formed on the light incident surface of the non-planar layer formed, a planarization film is formed on a light incident surface of the inorganic film formed, a resist is formed on a light incident surface of the planarization film formed, a thermal reflow process is performed on the image pickup element on which the resist has been formed, and etching is performed on the image pickup element on which the thermal reflow process has been performed.

Advantageous Effects of Invention

According to the present technology, deterioration of the sensitivity characteristics can be reduced.

BRIEF DESCRIPTION OF DRAWINGS

FIG. 9 is a diagram showing an example of each layer of a multilayer microlens.

FIG. 10 is a diagram showing an example of each layer of a multilayer microlens.

FIG. 11 is a diagram showing an example of each layer of a multilayer microlens.

FIG. 12 is a diagram showing an example of each layer of a multilayer microlens.

FIG. 13 is a diagram showing an example of each layer of a multilayer microlens.

FIG. 14 is a diagram showing an example of each layer of a multilayer microlens.

DESCRIPTION OF EMBODIMENTS

Embodiments for carrying out the present disclosure (hereinafter referred to as embodiments) will now be described. Note that the description will be given in the following order.

1. First Embodiment (Image Pickup Device)
2. Second Embodiment (Manufacturing Device, Manufacturing Method)
3. Third Embodiment (Manufacturing Device, Manufacturing Method)
4. Fourth Embodiment (Image Pickup Device)
5. Fifth Embodiment (Computer)

1. First Embodiment

[1-1 CSP]

A solid-state image pickup device, which includes a large number of image pickup regions, and an optical element having microlenses etc., on a semiconductor wafer, is hermetically molded after electrical interconnects have been formed, and is used as a photosensor for digital video equipment, such as a digital still camera, a camera for a mobile telephone, a digital camcorder, etc.

Figure 1:
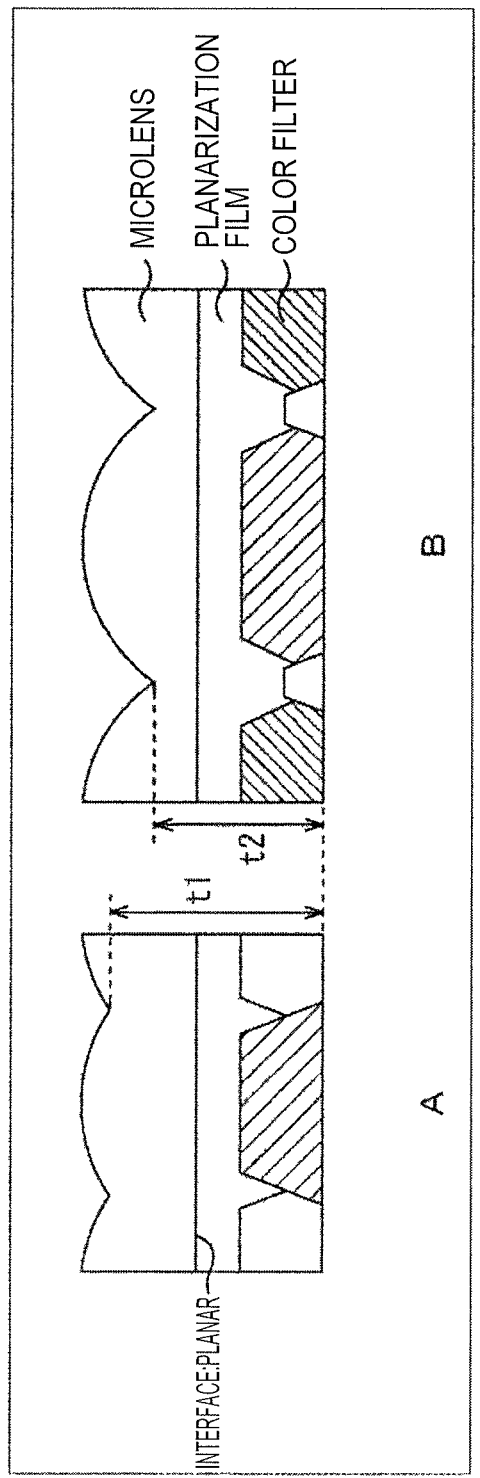
FIG. 1 is a diagram showing an example configuration of a portion of the layers of an image pickup element.

FIG. 1 shows an example configuration of microlenses and color filters in a solid-state image pickup element. In the example of FIG. 1, filters having different colors of the color filters have different thicknesses, and therefore, projections and recesses are formed on the light incident surface of the color filters Therefore, a planarization film is formed on the light incident surface to planarize the light incident surface. The microlenses are formed on the light incident surface of the planarization film.

Cross-sectional views shown in A of FIG. 1 and B of FIG. 1 have different cross-sectional directions. A thickness from the bottom surface of the color filter to the bottom surface of the microlenses in the cross-sectional view shown in A of FIG. 1 is t1, and a thickness from the bottom surface of the color filter to the bottom surface of the microlens in the cross-sectional view shown in B of FIG. 1 is t2.

In order to achieve the recent smaller size, thinner size, and higher-density implementation of video equipment, the chip size package (CSP) technique, which is a technique of establishing electrical connections by forming through electrodes and redistribution lines during an assembly process on the wafer, has been studied as the structure of a solid-state image pickup device, instead of the ceramic-type or plastic-type package, in which electrical connections are established by traditional die bonding and wire bonding.

Figure 2:
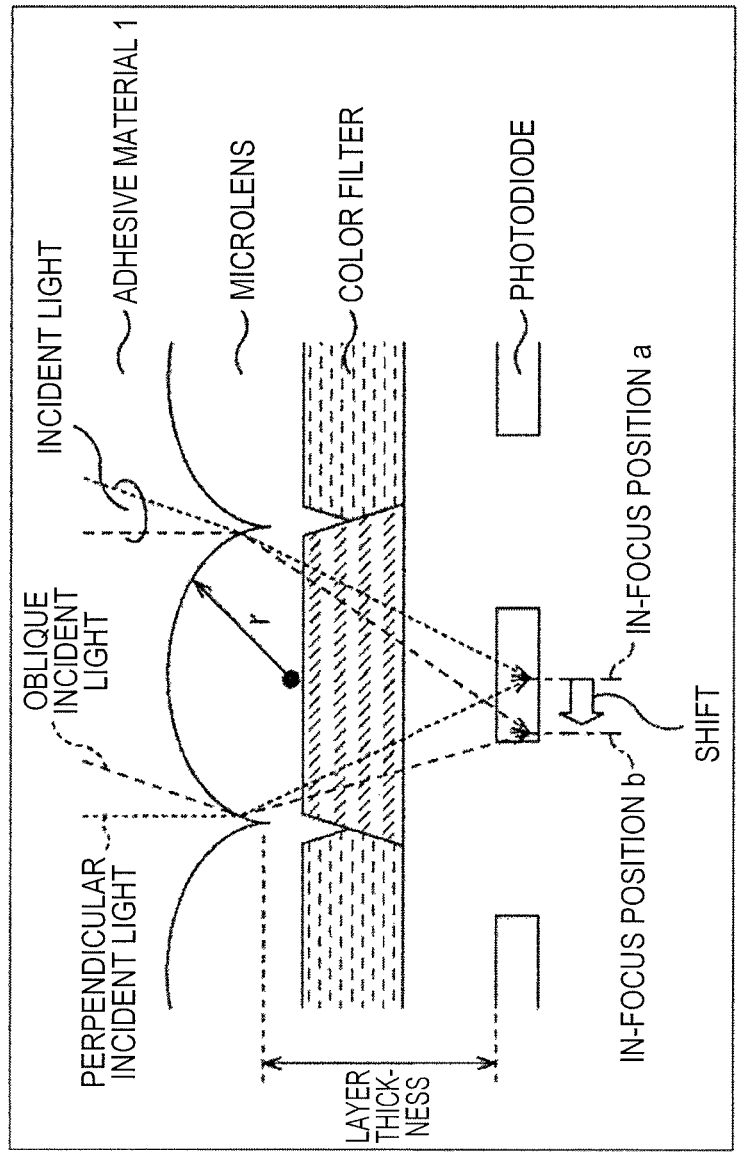
FIG. 2 is a diagram for describing a shift of an in-focus position.

FIG. 2 shows how incident light is collected by a microlens, passes through the color filter, and focused onto the photodiode. From the viewpoint of the light collection characteristics, the refractive indices of the microlens and an adhesive material 1 are required to satisfy the following relationship.

Microlens>Adhesive Material 1

As shown in FIG. 2, the incident light to the solid-state image pickup element includes perpendicular incident light and oblique incident light containing a perpendicular component and an oblique component. The light collection characteristics with respect to the perpendicular incident light to the photodiode can be adjusted by changing the radius of curvature (r) of the arc-shaped microlens. However, for the oblique incident light, the focus position of the perpendicular incident light is shifted. In order to reduce the amount of the shift, it is necessary to reduce the layer thickness. By reducing the layer thickness to adjust the radius of curvature of the microlens, the sensitivity characteristics or luminance shading of the solid-state image pickup element are improved.

When the CSP structure is employed as the package structure of a solid-state image pickup element, there is typically an empty space on the microlens. The refractive index of the microlens is about 1.50 to 1.6 when the microlens is made of a typical resin, such as an acrylic-based resin or a styrene-based resin. Therefore, the light collection characteristics are determined, from the refractive index of 1.0 of air, by the microlens having a refractive index of about 1.5 to 1.6 (the refractive index difference $\Delta n$: about 0.5 to 0.6).

However, when the CSP structure is employed, then if the adhesive material 1 formed on the microlens contains fluorine in its acrylic-based resin or siloxane-based resin, the refractive index is about 1.4 to 1.43. Alternatively, when the acrylic-based resin or the siloxane-based resin contains hollow silica, the refractive index is about 1.3 to 1.4. Here, when the microlens is made of a material of about 1.5 to 1.6 as described above, $\Delta n$ is about 0.07 to 0.3, and therefore, the light collection power of the microlens is likely to decrease. If the light collection power decreases, the focal length of the microlens increases, and therefore, it is necessary to increase the layer thickness of FIG. 2, leading to the risk of deterioration of the sensitivity characteristics of the solid-state image pickup element having the increased thickness.

As described above, when the adhesive material 1 is made of a material having a refractive index of about 1.3 to 1.43, it is necessary to set the refractive index of the microlens to about 1.8 to 2.03 in order to achieve light collection power similar to when the CSP structure is not employed (there is air on the microlens). The microlens is also required to have high transparency with respect to visible light (400 to 700 nm). There is not a single organic material which has these characteristics in terms of refractive index and transparency. In contrast to this, a refractive index which can be improved by adding fine particles of a metal oxide, such as, for example, zinc oxide, zirconium oxide, niobium oxide, titanium oxide, tin oxide, etc., into a polyimide-based resin, a siloxane-based resin, a phenol-based resin, etc., can be adjusted based on the amount of the fine metal oxide particles which are added, and can be adjusted to about 1.6 up to about 2.0.

In addition the above technique of adding fine particles of a metal oxide into an organic material, silicon oxynitride film (SiON) or silicon nitride film (SiN), which are typically used in semiconductor manufacturing processes, can be used as a material which has both a refractive index and transparency.

However, when inorganic film, such as silicon oxynitride film (SiON) or silicon nitride film (SiN) etc., is used as a material for the microlens, the microlens is likely to be displaced at an interface between the inorganic film containing the microlens material and the organic film formed below the inorganic film due to the difference in thermal expansion coefficient etc. (thermal expansion coefficient: the inorganic film<the organic film), depending on a thermal treatment step in the manufacturing process of the solid-state image pickup device after the formation of the microlens, or environmental conditions (particularly, high temperature, high humidity) after the manufacture of the solid-state image pickup device is completed. If the displacement occurs, the sensitivity characteristics or color non-uniformity characteristics of the solid-state image pickup device is likely to vary, leading to deterioration of image quality.

Therefore, in order to achieve a smaller size, thinner size, and higher-density implementation of video equipment, a wafer-level CSP is newly devised and implemented as the structure of a solid-state image pickup device, in order to achieve sensitivity characteristics which are greater than or equal to those of conventional packages in which air is present on a conventional microlens even if an adhesive material is provided on the microlens. A feature of the wafer-level CSP is that a microlens including a plurality of layers of inorganic film, such as SiON, SiN, SiO, etc., which is formed, corresponding to each light receiving region of the solid-state image pickup element, is formed on an underlying film which has a projection-and-recess shape at least due to the color filters. The microlenses are formed directly on the color filters which have a projection-and-recess shape, or on a non-planar film formed on the color filters which have a projection-and-recess shape. Also, the projection-and-recess shape can prevent the displacement of the microlens, whereby a structure of a solid-state image pickup device which does not have deterioration of image quality and has high reliability, and a method for manufacturing the solid-state image pickup device, are provided.

Note that Patent Literatures 1 and 2 disclose methods for manufacturing a microlens made of inorganic film, such as SiN, SiON, etc.

Patent Literature 1 discloses a method for manufacturing a microlens which has a reduced gap between each microlens made of inorganic film and a reduced distance between the photodiode and the microlens, thereby improving the sensitivity characteristics of a solid-state image pickup element.

In the method described in Patent Literature 1, which is a microlens manufacturing method, a thermal mask layer (a material layer which will be a microlens) made of an organic material which is formed in the top portion is deformed by a thermal treatment to form a microlens shape which has a gap between each microlens. A lens material layer (a layer which will be a microlens) made of an inorganic material is formed below the thermal mask layer, and thereafter, a middle layer made of an organic material is provided between this mask layer and the lens material layer. Patent Literature 1 discloses that, after etching the middle layer under predetermined conditions into a mask layer having a microlens shape having a gap between each microlens to provide a greater middle layer lens shape (a reduced microlens gap), the lens material layer made of an inorganic material, a microlens gap, is etched using the middle layer as a mask, whereby a microlens having an extremely reduced gap between each microlens can be formed.

Also, Patent Literature 1 discloses that SiN and SiOSiON are applicable to the lens material layer made of an inorganic material. In this case, when SiN or SiON is selected as this material layer, the light collection power of the microlens is improved, and at the same time, the gap between each microlens is reduced, and the distance from the photodiode to the microlens is reduced by transferring the mask layer to the middle layer by etching and further continuing the etching, thereby improving the light collection efficiency of the microlens.

However, because the shape is further transferred to the lens material layer through the middle layer by etching, it is likely to take a longer time to perform etching. This etching process is performed by plasma etching, and therefore, the plasma damage is likely to adversely affect the solid-state image pickup device. Specifically, the dark-current characteristics etc. of the solid-state image pickup element is likely to deteriorate due to the longer etching time. At the same time, the longer processing time also increases variations in etching on a semiconductor wafer substrate surface or between wafer substrates, which is likely to cause variations in the position in the cross-sectional direction of the microlens, leading to an adverse influence on the sensitivity characteristics etc. of the solid-state image pickup element. Moreover, in addition to the processing time of the etching device due to the longer wafer processing time, the formation of the middle layer increases the number of steps, leading to the risk of an increase in cost.

Moreover, Patent Literature 1 describes the color filters, but not the number of the colors. In the microlens manufacturing method including the long-time etching, it is likely to be difficult to adjust the position in the height direction of the bottom portion of the microlens.

Also, Patent Literature 2 discloses a method for manufacturing a microlens including two layers. In the microlens disclosed in Patent Literature 2, SiO, SiN, or SiON is used as an inorganic material. Typically, the refractive index of SiN is about 1.85 to 2.0, and the refractive index of SiON is about 1.6 to 1.8. Therefore, these are higher than the refractive index (about 1.5 to 1.6) of an acrylic-based resin or a styrene-based resin which is typically used in a microlens, and therefore, can improve the light collection power of the microlens.

Such a microlens with high light collection power is a gapless microlens which is formed by adjusting the film formation of the microlens in the second layer so that there is not a gap between each microlens. However, when the micro in the second layer is formed so that a gap of the microlens in the first layer having a gap is reduced, the position of the microlens which is finally formed is raised (further away from the photodiode surface), and therefore, it is likely that the sensitivity characteristics etc. of a solid-state image pickup device in which the distance between the photodiode and the microlens is reduced as in, for example, a back-illuminated solid-state image pickup device, cannot be improved.

Moreover, Patent Literature 2 discloses that the inorganic material used in the microlens in the first layer and the microlens in the second layer can be selected from SiO, SiN, and SiON, but does not disclose the refractive index of each layer or the relationship between the film thicknesses of the layers.

In order to improve the light collection characteristics of a microlens, it is necessary to consider the reduction of the gap between each lens and the distance from the photodiode (the layer thickness of FIG. 2), and in addition to these, the surface reflectance. However, Patent Literature 2 does not disclose this relationship. Therefore, for example, when SiO, which has a low refractive index, is selected as a material for the microlens in the first layer, and SiON, which has a high refractive index, is selected as a material for the microlens in the second layer, the surface reflection of the microlens increases, leading to the risk of deterioration of the sensitivity characteristics of a solid-state image pickup device.

Moreover, Patent Literature 2 discloses that the microlens should be formed on a planarized surface. Patent Literature 2 discloses that the reason is to remove the level difference caused by the color filters, and that a planarization layer is formed on the color filters. Also, the planarization layer may not be formed. This seems to refer to the case where there is not a level difference caused by the color filters. Also, Patent Literature 1 does not describe a planarization film on the color filters. As shown in FIG. 1 of Patent Literature 1, a monochromatic color filter structure is shown, and therefore, it seems that there is not a level difference caused by the color filters.

As described above, in both Patent Literature 1 and Patent Literature 2, color filters are included, and an interface between a planarization film made of organic film formed on the color filters and microlenses made of inorganic film formed on the planarization film seems to be substantially planar.

Thus, when the interface between the inorganic film containing the microlens material and the organic film formed below the inorganic film is planar, the microlens is likely to be displaced due to the difference in thermal expansion coefficient between the materials, etc.

[1-2 Lower Profile]

Therefore, an image pickup element may include a non-planar layer which has a non-planar light incident surface in a light receiving region, and a microlens of an inorganic material which is provided on the light incident surface of the non-planar layer, and collects incident light.

Also, the microlens may include a plurality of layers.

Moreover, the layers of the microlens including the plurality of layers may have different refractive indices.

Also, the layers of the microlens including the plurality of layers may have different curved surface shapes.

Moreover, a portion of the layers of the microlens including the plurality of layers may be formed of an organic material.

Also, an anti-reflection film may be formed on a light incident surface of the microlens.

Moreover, the image pickup element may further include an adhesive material layer provided on a light incident surface of the microlens.

Also, the non-planar layer may have a filter.

Moreover, the filter may include filters with a plurality of colors having different thicknesses in a direction in which light passes.

Also, the filters having the different thicknesses may be arranged in a Bayer arrangement, corresponding to red, green, and blue pixels, and the green filters may be linked between pixels.

Moreover, the filter may be formed of an organic material.

Also, the non-planar layer may have an organic film which is formed on the filter and has a non-planar light incident surface.

Moreover, heights of projections and recesses of a light incident surface of the organic film may be lower than heights of projections and recesses of a light incident surface of the filter.

Also, the refractive index of the organic film may be between the refractive index of the filter and the refractive index of the microlens.

Moreover, the non-planar layer may have an inter-pixel light shield film.

Also, the non-planar layer may have projections and recesses on the light incident surface due to a difference in height between the filter and the inter-pixel light shield film.

Moreover, a chip size package structure may be formed.

Note that an image pickup device may include an image pickup element which captures an image of an object, and outputs the image of the object as an electrical signal, and an image processing unit which processes the image of the object obtained by the image pickup element. The image pickup element may include a non-planar layer which has a non-planar light incident surface in a light receiving region, and a microlens of an inorganic material which is provided on the light incident surface of the non-planar layer, and collects incident light.

Moreover, a manufacturing device may include a non-planar layer forming unit which forms a non-planar layer having a non-planar light incident surface in a light receiving region of an image pickup element, an inorganic film forming unit which forms an inorganic film on the light incident surface of the non-planar layer formed by the non-planar layer forming unit, a planarization film forming unit which forms a planarization film on a light incident surface of the inorganic film formed by the inorganic film forming unit, a resist forming unit which forms a resist on a light incident surface of the planarization film formed by the planarization film forming unit, a thermal reflow process unit which performs a thermal reflow process on the image pickup element on which the resist has been formed by the resist forming unit, and an etching process unit which performs etching on the image pickup element on which the thermal reflow process has been performed by the thermal reflow process unit.

Of course, a manufacturing method of the manufacturing device may be provided.

Thus, not only a smaller size, thinner thickness, and higher-density implementation of video equipment can be achieved, but also, when a wafer-level CSP is implemented as the structure of a solid-state image pickup device, even if an adhesive material is provided on the microlens, sensitivity characteristics which are greater than or equal to those of conventional packages in which air is present on a conventional microlens, can be obtained.

[1-3 Image Pickup Device]

Figure 3:
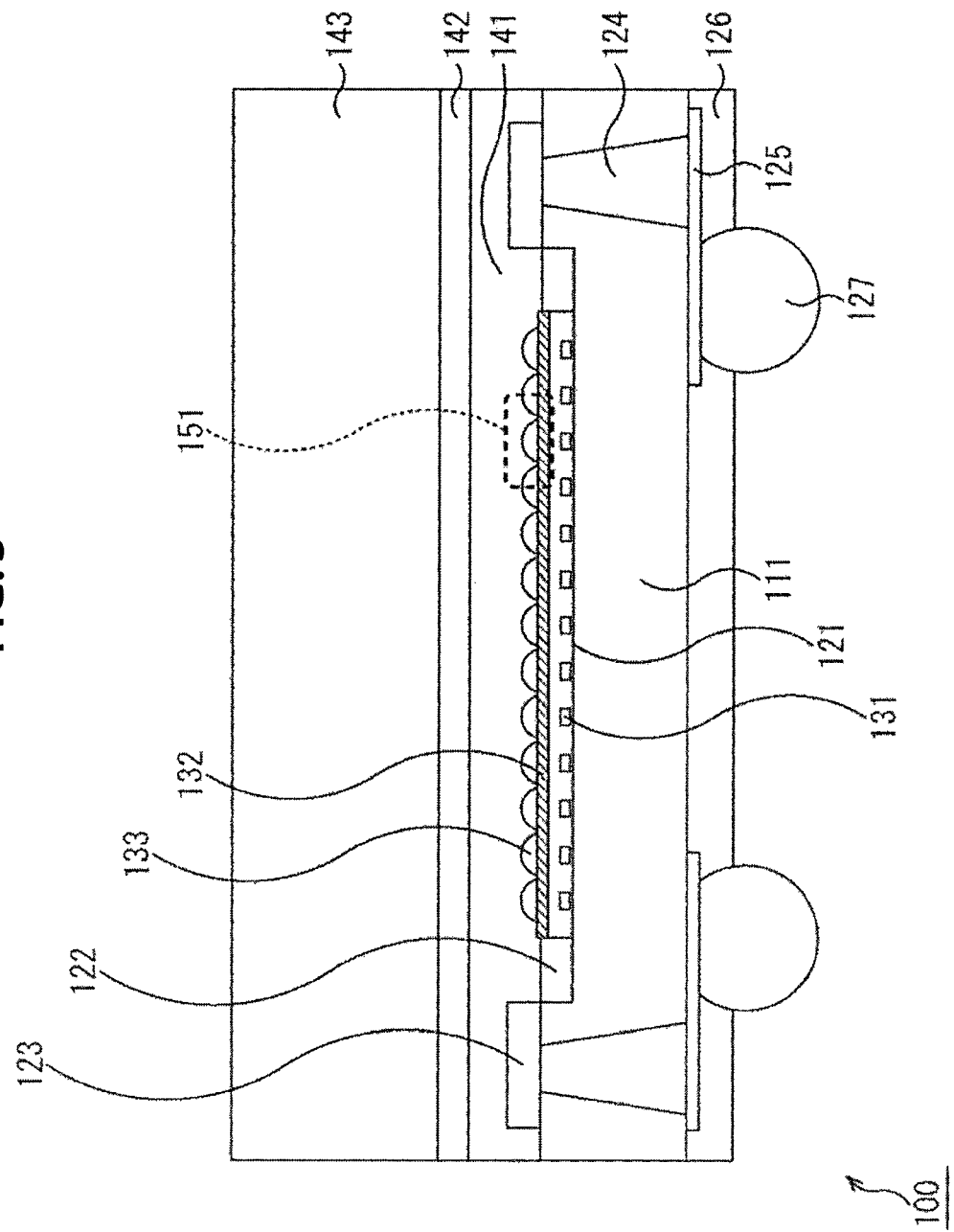
FIG. 3 is a diagram showing an example main configuration of an image pickup device.

A more specific example will be described. FIG. 3 is a diagram showing an example main configuration of an image pickup device. The image pickup device 100 shown in FIG. 3, which may be included as an image pickup element in another device, converts light from an object into electricity, and outputs an image of the object as an image signal.

The image pickup device 100 shown in FIG. 3 is formed to have the CSP structure. The image pickup device 100 includes a solid-state image pickup element which includes an image pickup region 121 which is formed on a semiconductor substrate 111 and on a surface of which a plurality of color filters 132, a plurality of microlenses 133, and a plurality of photodiodes 131, etc., are provided, a peripheral circuit region 122 which is formed in an outer peripheral region of the image pickup region 121 of the semiconductor substrate 111, and a plurality of electrode portions 123 formed in the peripheral circuit region 122.

Also, a transparent substrate 143 made of, for example, optical glass etc. is formed on a main surface of the solid-state image pickup element above the microlenses 133 with an adhesive material A 141 and an adhesive agent B 142 made of a resin-based material being interposed therebetween. Moreover, on a back surface opposite to the main surface of the solid-state image pickup element, metal interconnects 125 connecting to the plurality of electrode portions 123 in the peripheral circuit region 122 are formed with through electrodes 124 penetrating through the semiconductor substrate in the thickness direction being interposed therebetween, and an insulating resin layer 126 which has openings which cover the metal interconnects 125 and expose a portion thereof is formed. External electrodes 127 made of, for example, a solder material are formed in the openings. Note that the solid-state image pickup element is electrically insulated from the through electrode 124 and the metal interconnect 125 by an insulating layer (not shown).

In the image pickup device 100, the plurality of electrode portions 123 are electrically connected to the metal interconnects 125 through the through electrodes 124, and also, are electrically connected to the external electrodes 127 through the metal interconnects 125, and therefore, a received light signal can be extracted.

Figure 4:
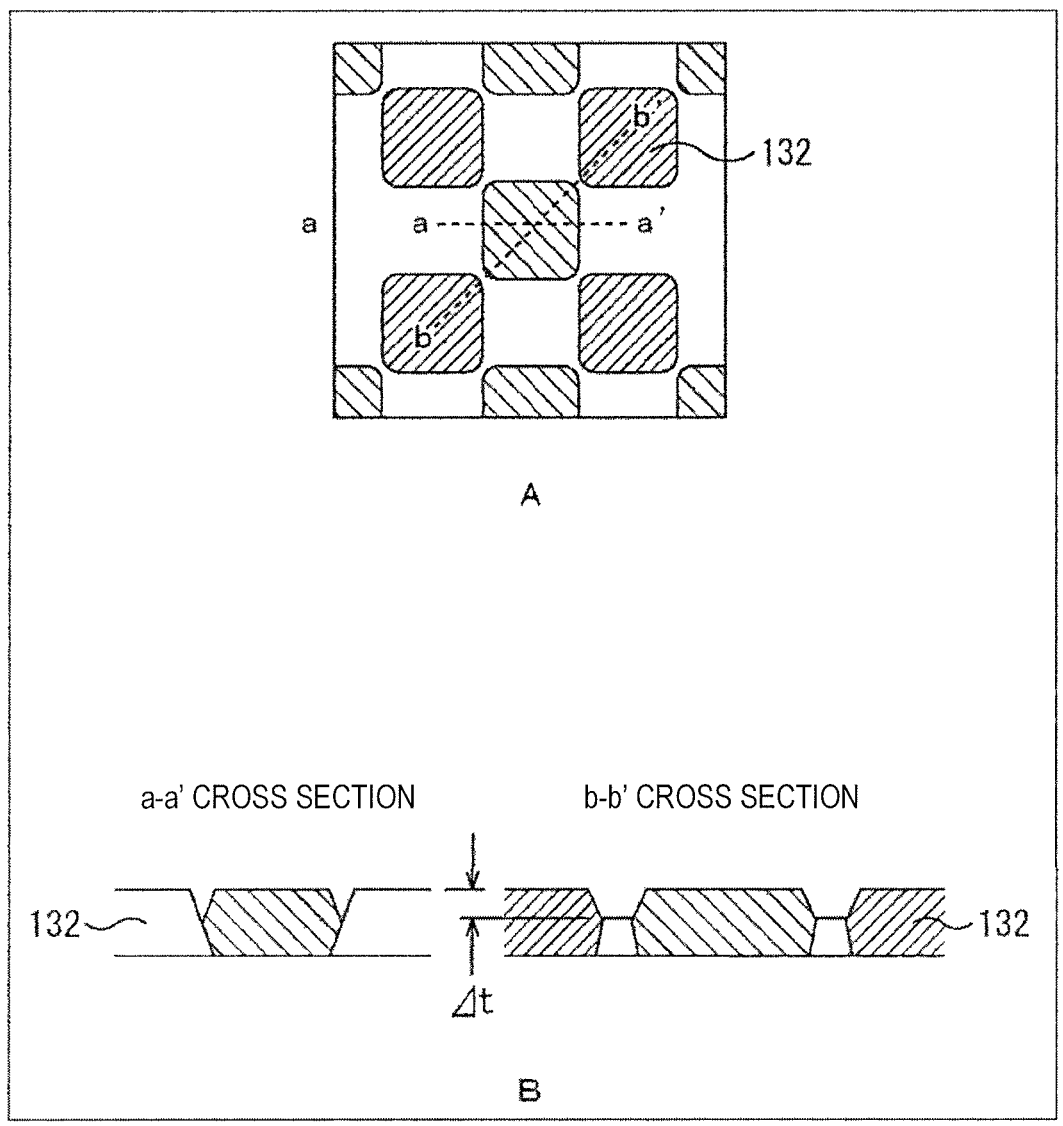
FIG. 4 is a diagram showing an example configuration of color filters.

A of FIG. 4 shows a plan view of the color filters 132 of red, green, and blue in a Bayer arrangement formed in the same light receiving region of the solid-state image pickup element. Also, B of FIG. 4 shows a cross section (a side direction of the color filter 132) taken along the a-a' direction in A of FIG. 4, and a cross section (a diagonal direction of the color filter 132) taken along the b-b' direction. As shown in A of FIG. 4 and B of FIG. 4, the green color filters are linked together at their four corners, and a red or blue color filter is formed in the openings of the green color filters.

Here, as shown in B of FIG. 4, the green color filters linked together at their four corners are formed to have a small thickness. Typically, a material for the color filter 132 used in the solid-state image pickup element is provided by adding a pigment or a dye, which are colorants, into photo-polymerization negative photosensitive resin. Although it is desirable that each color filter should be formed to have a pixel size of the solid-state image pickup element, the color filters 132 need to be formed to overlap in order to ensure the cohesiveness of the color filters 132 or prevent the occurrence of a gap due to misalignment of color filters of each color, etc. By forming the green color filters linked together at their four corners, the cohesiveness can be improved, and the occurrence of a gap can be reduced.

Here, if the four corners of the green color filter are formed to have a sufficient width, the pattern size increases, and therefore, the opening in which a red or blue color filter is to be formed is narrowed. For example, the green color filter enters a pixel in which a red or blue color filter should be formed, and the size of the red or blue color filter formed decreases, and as a result, the sensitivity with respect to blue or red decreases, or the color mixture of a green color component occurs, resulting in deterioration of characteristics of the solid-state image pickup element.

In order to cause the green color filter size to be as close to the pixel size as possible, and ensure the cohesiveness, it is necessary to increase the contact area, and in addition, form the color filters while avoiding a break in the four corner linkage portions of the green color filter, and eliminating a gap between each of the red, green, and blue color filters. It is necessary to form the color filters using an exposure mask whose mask pattern size is smaller than or equal to the limit of the resolution of the photosensitive resin during the formation of the color filters using photo-polymerization negative photosensitive resin. Typically, the color filters are formed using the exposure mask size which is 200 nm or less during the formation of the four corners. When the photo-polymerization negative photosensitive resin is formed using the exposure mask size which is smaller than or equal to the limit of the resolution, the photo-polymerization reaction is not sufficiently performed, so that that portion has a small film thickness (Δt).

Figure 5:
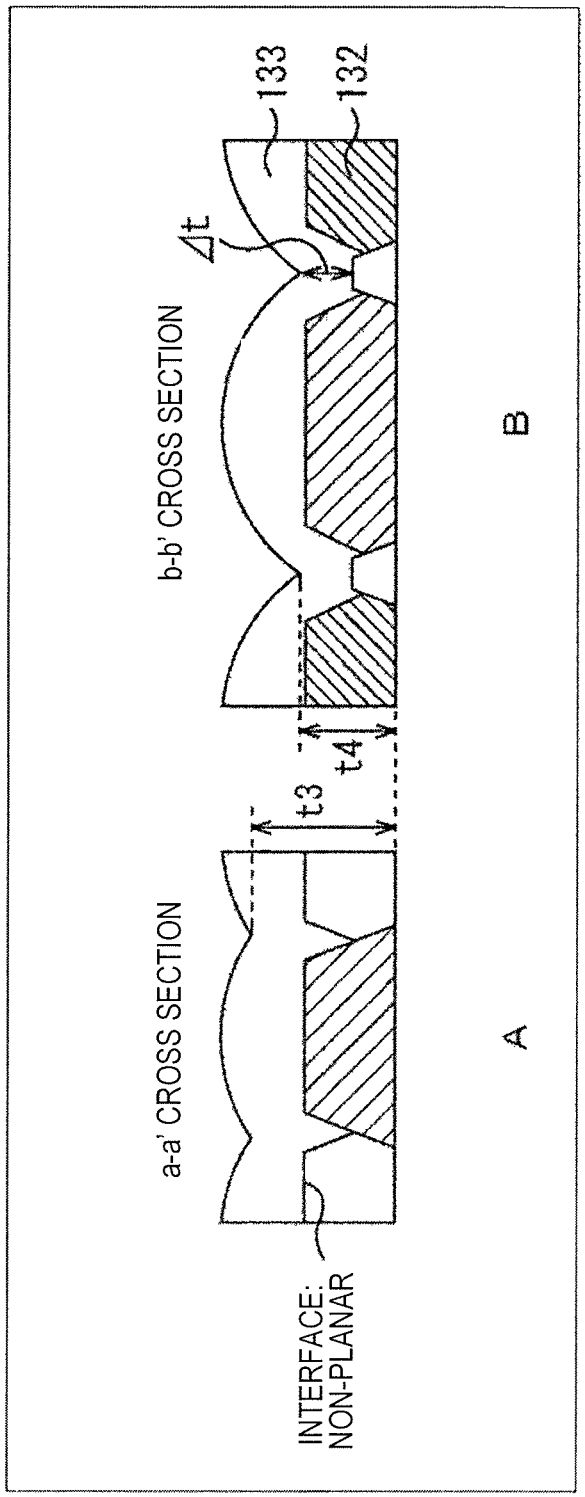
FIG. 5 is a diagram showing an example configuration of a portion of the layers of an image pickup element.

As shown in A of FIG. 5 and B of FIG. 5, microlenses made of inorganic film are formed above the red, green, and blue color filters 132 thus formed in a Bayer arrangement shown in A of FIG. 4 and B of FIG. 4.

As described above, in the case of the conventional structure, as shown in A of FIG. 1 a thickness from the bottom surface of the color filter to the bottom surface of the microlens is t1, and as shown in B of FIG. 1 a thickness from the bottom surface of the color filter to the bottom surface of the microlens is t2.

In contrast to this, in the example of FIG. 5, although the color filters 132 have a level difference, a microlens including a single layer or a plurality of inorganic films is formed on the color filter without a planarization film (described below). Here, the thicknesses from the bottom surface of the color filter to the bottom surface of the microlens in the a-a' direction and in the b-b' direction are t3 and t4.

Here, t1 and t2 are compared with t3 and t4. In the example of FIG. 1, a bottom portion of the microlens is formed in the inorganic film. In the example of FIG. 5, although a bottom portion of the microlens 133 is similarly formed in the inorganic film, a planarization film is not formed, and therefore, the thicknesses have relationships t1>t3 and t2>t4, and the layer thickness can be reduced. In other words, in the example of FIG. 5, the sensitivity characteristics of the solid-state image pickup element can be further improved.

Also, as shown by Δt in B of FIG. 5, the four corner portions of the green color filter can be formed to be thin, and therefore, the thickness can be proportionately reduced. Here, the bottom portion of the microlens in the b-b' cross section is formed at a position where the green color filter is not exposed. This is because if the color filter 132 is exposed, the colorant contained in the color filter 132 is also etched, so that the inner wall of the etching processing chamber of the etching device is stained with the colorant. If the inner wall of the etching processing chamber is stained, the influence of dust, metal contamination in a metal-containing colorant, etc., causes a decrease in the yield of the image pickup device 100.

Figure 6:
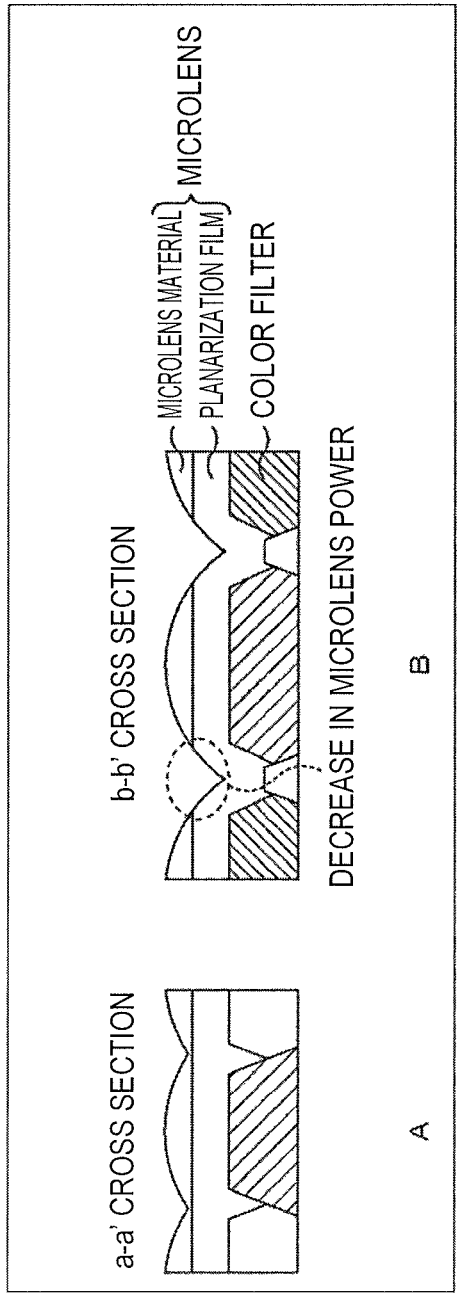
FIG. 6 is a diagram showing an example configuration of a portion of the layers of an image pickup element.

Moreover, in the example of FIG. 1, by additionally applying etching to the state shown, the distance from the bottom portion of the color filter 132 to the bottom portion of the microlens 133 can be reduced. However, in this case, as shown in B of FIG. 6, the microlens is formed with the planarization film being exposed in the vicinity of the bottom portion of the microlens in the b-b' cross-sectional direction. Therefore, the light collection power decreases in the bottom portion of the microlens in which the planarization film is exposed, due to the relationship of the refractive indices, leading to the risk of deterioration of the sensitivity characteristics of the solid-state image pickup element.

Figure 7:
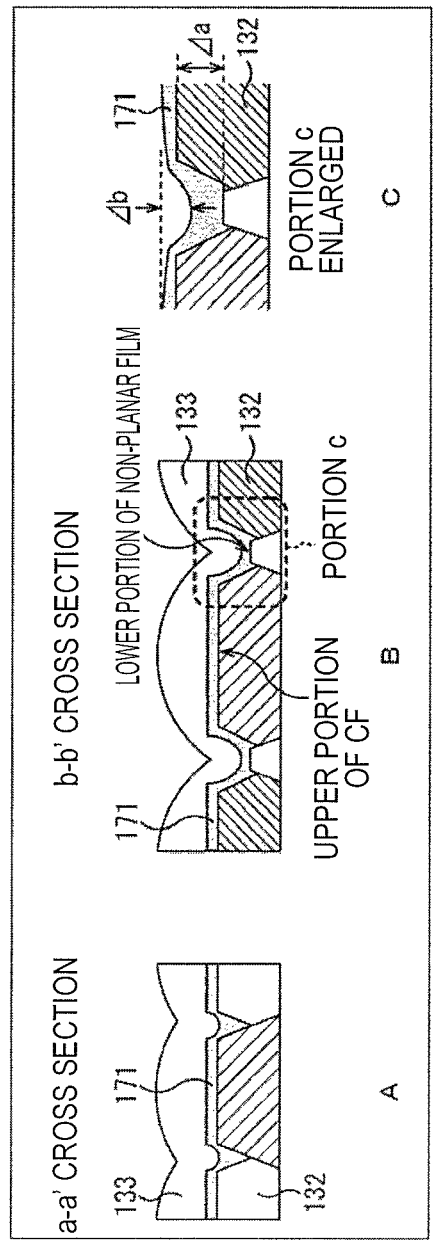
FIG. 7 is a diagram showing an example configuration of a portion of the layers of an image pickup element.

Note that, as shown in FIG. 7, a non-planar film 171 may be formed on the color filter 132. In this case, an organic material or an inorganic material is selected to form the non-planar film 171 so that a level difference Δa in FIG. 7 is reduced at the four corner portions of the green color filter. As the organic material, an acrylic-based resin, a styrene-based resin, an acrylic-styrene copolymer-based resin, etc. is used. The inorganic material is selected from silicon oxide film (SiO), SiON, SiN, etc. Here, by forming the non-planar film 171, the planarity of the microlens 133 made of inorganic film formed on the non-planar film 171 as it is formed is improved (Aa>Ab). Also, when, for the non-planar film, an acrylic-based resin is selected from the organic materials, SiON is formed on an upper surface of the non-planar film. This is because when the microlens 133 is made of SiN, the occurrence of creases due to the difference in stress between the films is prevented. In order to prevent the occurrence of creases, a styrene-based resin or an acrylic-styrene copolymer-based resin, which has a higher cured density of film than that of acrylic-based resins, is used.

As described above, the non-planar film 171 is formed on the color filter 132, whereby the thickness from the lower portion of the color filter 132 to the lower portion of the microlens 133 is reduced. Even if the non-planar film 171 is exposed in the cross-section of the b-b' direction, the area where the non-planar film 171 is exposed is small, and therefore, the light collection power of the microlens 133 is substantially equal to that of the structure shown in FIG. 5 etc., leading to an improvement in the sensitivity of the solid-state image pickup element. Moreover, when the non-planar film 171 is made of SiON, then if the refractive index is set to be between those of the color filter and the microlens, the interfacial reflection can be reduced, leading to a further improvement in the sensitivity characteristics or a reduction in the flare characteristics.

For example, when the refractive index of the color filter 132 is about 1.51 to 1.75, and SiN, which has a refractive index of about 1.9, is used as a material for the microlens, SiON is formed to have an intermediate refractive index therebetween by suitably adjusting conditions for the film formation.

Figure 8:
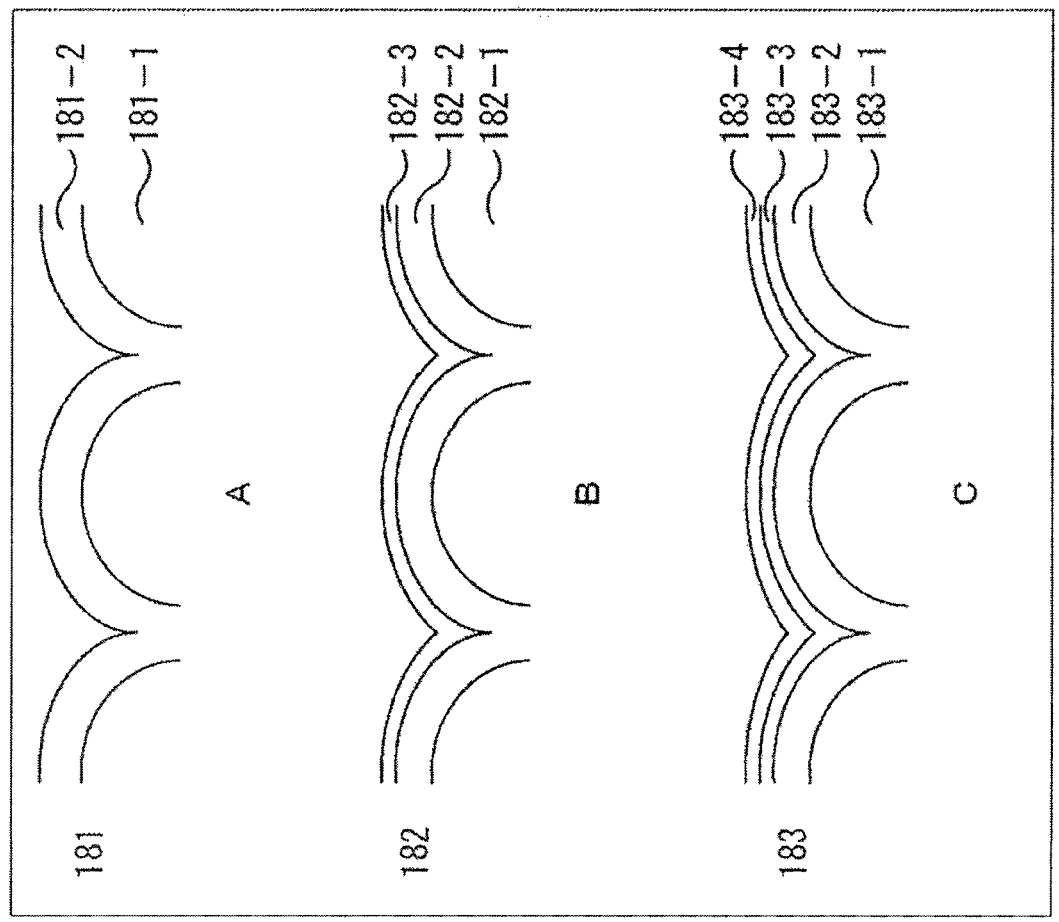
FIG. 8 is a diagram showing an example configuration of a multi-layer microlens.

Note that the microlens 133 may include a plurality of layers. An example of the structure will be described using FIG. 8. Note that FIG. 8 shows an a-a' cross section of A of FIG. 5. A multi-layer microlens 181 shown in A of FIG. 8 has a first microlens layer 181-1 and a second microlens layer 181-2. Each layer may have any of three configurations shown in a table of FIG. 9.

Note that the refractive indices are assumed to have the following relative order of magnitude.

First Microlens≥Second Microlens

Also, a multi-layer microlens 182 shown in B of FIG. 8 has a first microlens layer 182-1, a second microlens layer 182-2, and a third microlens layer 182-3. Each layer may have any of four configurations shown in a table of FIG. 10.

Note that the refractive indices are assumed to have the following relative order of magnitude.

First Microlens Layer=Second Microlens Layer≥Third Microlens Layer

Here, in the configurations of 2 and 4 (the first microlens layer=the second microlens layer>the third microlens layer), the second microlens layer mainly acts to reduce gaps in the first microlens layer, and the third microlens layer mainly functions as an anti-reflection film including a single layer.

A multi-layer microlens 183 shown in C of FIG. 8 has a first microlens layer 183-1, a second microlens layer 183-2, a third microlens layer 183-3, and a fourth microlens layer 183-4. Each layer may have any of two configurations shown in a table of FIG. 11.

Note that the refractive indices are assumed to have the following relative order of magnitude.

Third Microlens Layer>First Microlens Layer=Second Microlens Layer>Fourth Microlens Layer Here, the second microlens layer 183-2 mainly acts to reduce gaps in the first microlens layer 183-1, and the third microlens layer 183-3 and the fourth microlens layer 183-4 mainly function as an anti-reflection film including two layers.

In FIG. 11, as a material of (d), zirconium oxide (ZnO, refractive index: about 2.4), titanium oxide (TiO, refractive index: about 2.52), etc. may be used, and as a material of (e), silicon oxide film (SiO, refractive index: about 1.45), silicon oxycarbide film (SiOC, refractive index: about 1.4), magnesium fluoride (MgF, refractive index: about 1.37), etc. may be used.

As described above, when the microlens 133 includes a plurality of layers, a portion of the layers may be a microlens layer made of an organic material.

For example, in the example of A of FIG. 8, an organic microlens may be formed as the first microlens layer 181-1, and an inorganic microlens may be formed as the second microlens layer 181-2. In this case, each microlens layer may have any of two configurations shown in a table of FIG. 12.

Also, the refractive indices are assumed to have the following relative order of magnitude. Here, the refractive index of the organic microlens can be adjusted according to the amount of fine metal oxide particles added.

First Microlens≥Second Microlens

Here, the second microlens layer 181-2 mainly acts to reduce gaps between lenses in the first microlens layer 181-1.

For example, in the example of B of FIG. 8, an organic microlens may be formed as the first microlens layer 182-1, and inorganic microlenses may be formed as the second microlens layer 181-2 and the third microlens layer 181-3. In this case, each microlens layer may have any of four configurations shown in a table of FIG. 12.

Also, the refractive indices are assumed to have the following relative order of magnitude. Here, the refractive index of the organic microlens can be adjusted according to the amount of fine metal oxide particles added.

First Microlens Layer=Second Microlens Layer≥Third Microlens Layer

Here, in the configurations of 2 and 4 (the first microlens layer=the second microlens layer>the third microlens layer), the second microlens layer 182-1 mainly acts to reduce gaps in the first microlens layer 182-1, and the third microlens layer 181-3 mainly functions as an anti-reflection film.

For example, in the example of C of FIG. 8, an organic microlens may be formed as the first microlens layer 183-1, and inorganic microlenses may be formed as the second microlens layer 183-2, the third microlens layer 183-3, and the fourth microlens layer 184-3. In this case, each microlens layer may have any of two configurations shown in a table of FIG. 14.

Also, the refractive indices are assumed to have the following relative order of magnitude. Here, the refractive index of the organic microlens can be adjusted according to the amount of fine metal oxide particles added.

Third Microlens Layer>First Microlens Layer=Second Microlens Layer>Fourth Microlens Layer Here, the second microlens layer 183-2 mainly acts to reduce gaps in the first microlens layer 183-1, and the third microlens layer 183-3 and the fourth microlens 184-3 mainly function as an anti-reflection film including two layers.

In FIG. 14, as a material of (d), zirconium oxide (ZnO, refractive index: about 2.4), titanium oxide (TiO, refractive index: about 2.52), etc. may be used, and as a material of (e), silicon oxide film (SiO, refractive index: about 1.45), silicon oxycarbide film (SiOC, refractive index: about 1.4), magnesium fluoride (MgF, refractive index: about 1.37), etc. may be used.

2. Second Embodiment

[2-1 Manufacturing Device]

Next, a manufacturing device which manufactures the above-described image pickup device 100 (image pickup element) will be described.

Figure 15:
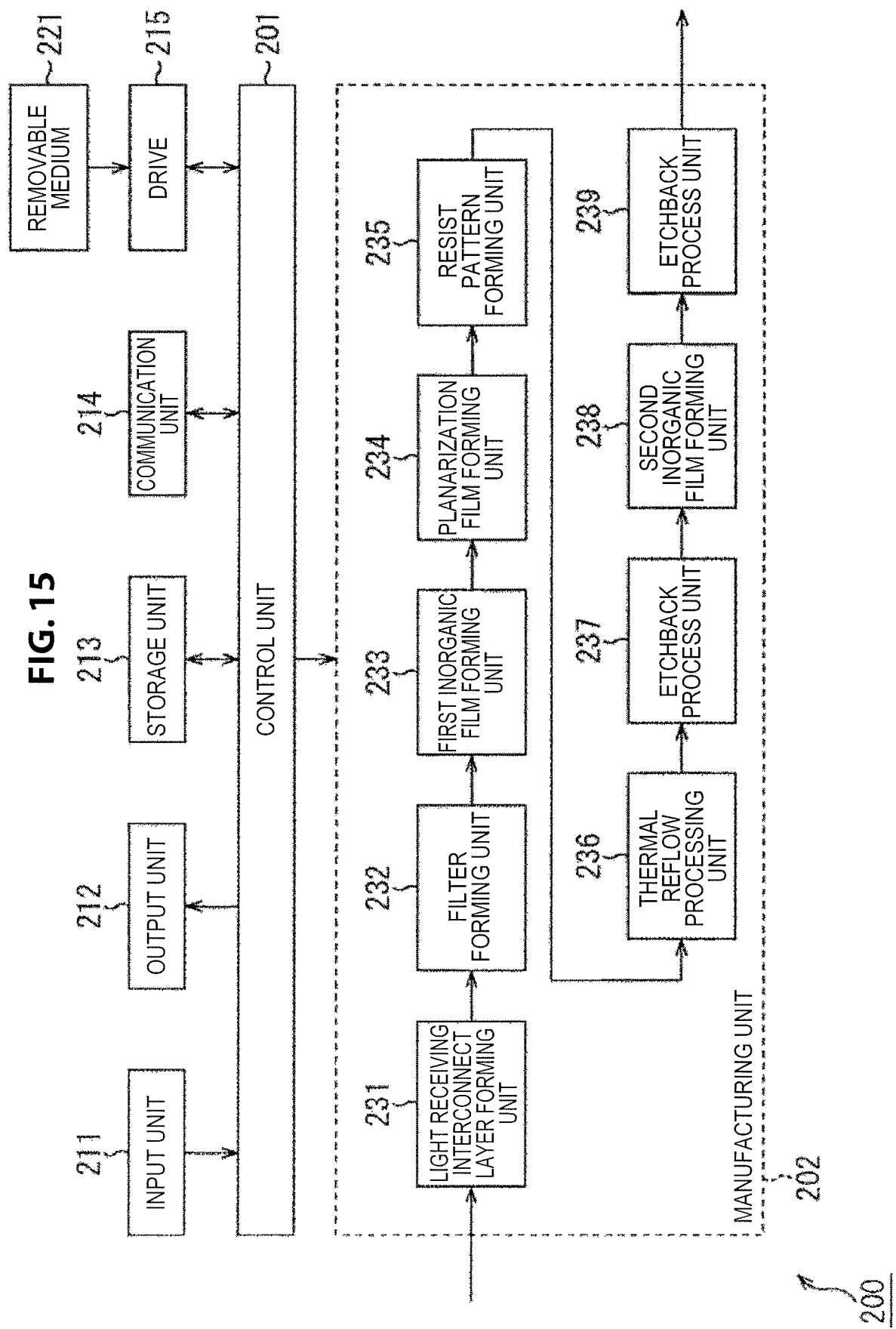
FIG. 15 is a block diagram showing an example main configuration of a manufacturing device.

FIG. 15 is a block diagram showing an example main configuration of a device for manufacturing the image pickup device 100. A manufacturing device 200 shown in FIG. 15 has a control unit 201 and a manufacture unit 202.

The control unit 201, which has, for example, a CPU (Central Processing Unit), a ROM (Read Only Memory), and a RAM (Random Access Memory), etc., controls each portion of the manufacture unit 202 to perform a control process involved in manufacture of the image pickup device 100 (image pickup element). For example, the CPU of the control unit 201 executes various processes according to programs stored in the ROM. Also, the CPU executes various processes according to programs loaded from a storage unit 213 to the RAM. The RAM also stores data which is required when the CPU executes various processes, etc., as appropriate.

The manufacture unit 202 is controlled by the control unit 201 to perform processes involved in manufacture of the image pickup device 100 (image pickup element). The manufacture unit 202 has a light receiving interconnect layer forming unit 231, a filter forming unit 232, a first inorganic film forming unit 233, a planarization film forming unit 234, a resist pattern forming unit 235, a thermal reflow processing unit 236, an etchback process unit 237, a second inorganic film forming unit 238, and an etchback process unit 239. The light receiving interconnect layer forming unit 231 to the etchback process unit 239 are controlled by the control unit 201 to perform processes of steps of manufacturing the image pickup device 100 (image pickup element) as described below.

Note that, here, for the sake of convenience, only steps involved in the present technology will be described. Actually, in order to manufacture the image pickup device 100 (image pickup element), other steps than those performed by these processing units are required. Although the manufacture unit 202 has processing units for those steps, those steps will not be described herein in detail.

The manufacturing device 200 has an input unit 211, an output unit 212, a storage unit 213, a communication unit 214, and a drive 215.

The input unit 211, which includes a keyboard, a mouse, a touch panel, and an external input terminal, etc., receives input of, and supplies to the control unit 201, a user's instruction or information from the outside. The output unit 212, which includes a display, such as a CRT (Cathode Ray Tube) display or an LCD (Liquid Crystal Display) etc., a speaker, and an external output terminal, etc., outputs various items of information supplied from the control unit 201 as an image, audio, or an analog signal or digital data.

The storage unit 213, which includes an SSD (Solid State Drive), such as a flash memory etc., or a hard disk, etc., stores information supplied from the control unit 201, or reads and supplies stored information in accordance with a request from the control unit 201.

The communication unit 214, which includes, for example, an interface or a modem, etc. for a wired LAN (Local Area Network) or a wireless LAN, performs a communication process with respect to an external device through a network including the Internet. For example, the communication unit 214 transmits information supplied from the control unit 201 to the other end of communication, or supplies information received from the other end of communication to the control unit 201.

The drive 215 is connected to the control unit 201 as required. And, a removable medium 221, such as a magnetic disk, an optical disk, a magneto-optical disk, or a semiconductor memory, etc., is loaded into the drive 215 as appropriate. And, a computer program read from the removable medium 221 through the drive 215 is installed in the storage unit 213 as required.

[2-2 Manufacturing Method]

Figure 16:
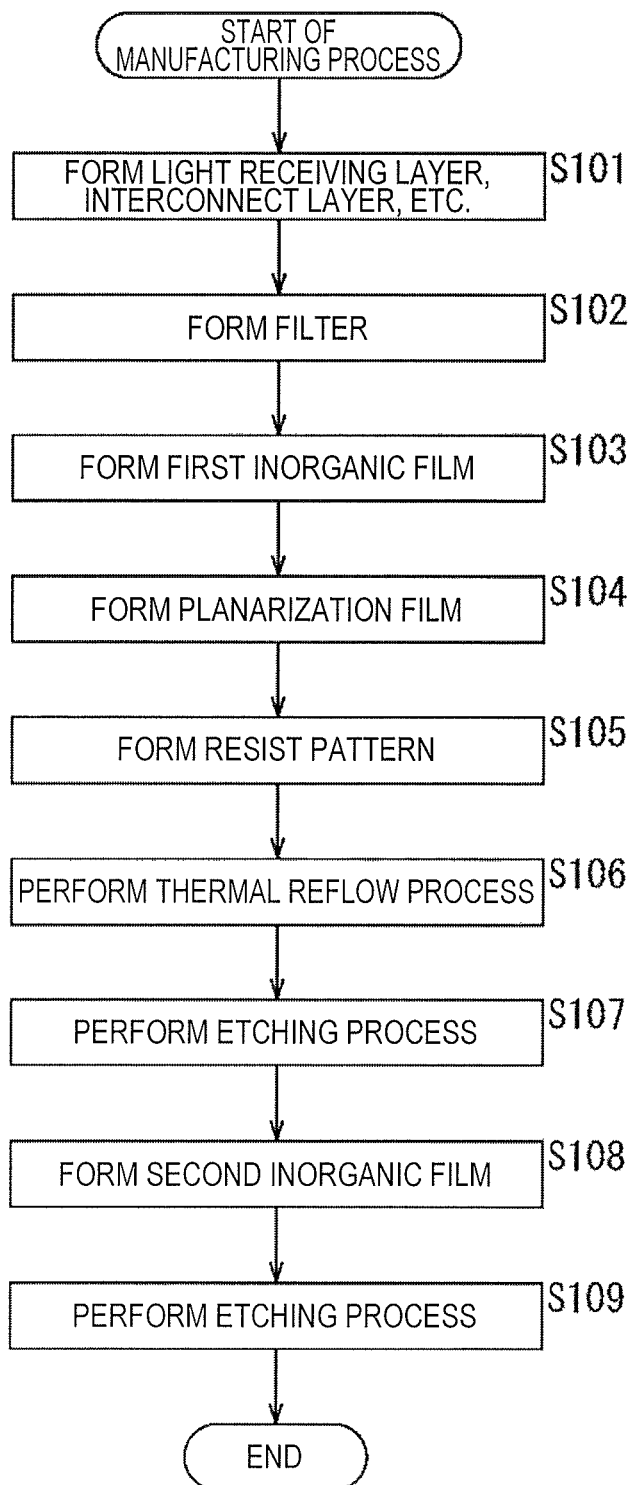
FIG. 16 is a flowchart for describing an example flow of a manufacture process.
Figure 17:
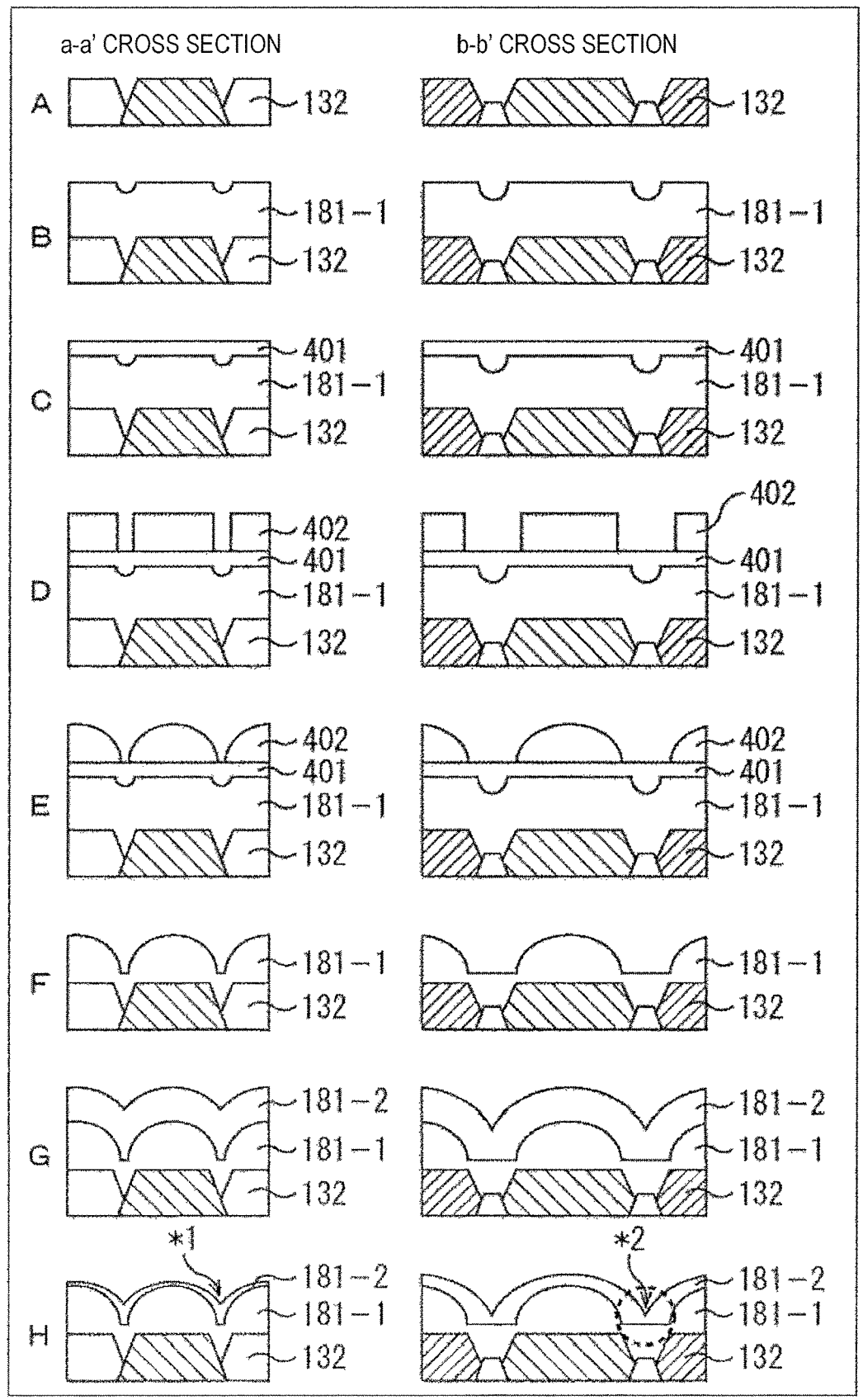
FIG. 17 is a diagram for describing how a manufacture process is performed.

An example flow of the manufacture process will be described with reference to a flowchart of FIG. 16. Note that reference is made to FIG. 17 as appropriate. FIG. 17 is a diagram for describing how each step of the manufacture process is performed.

When the manufacture process begins, in step S101 the light receiving interconnect layer forming unit 231 is controlled by the control unit 201 to form a light receiving layer, an interconnect layer, etc. on an N-type semiconductor substrate supplied from the outside.

In step S102, the filter forming unit 232 forms filters (A of FIG. 17). A of FIG. 17 shows the color filters 132 in a Bayer arrangement which are formed corresponding to respective pixels of the image pickup device 100. As a method for the color filter 132, a photosensitive resin into which, for example, a pigment or a pigment as a colorant is added is formed using photolithography. As the color filters 132, color materials, such as, for example, red, green, blue, etc., are formed. In this case, there is a level difference between adjacent color filters 132.

In step S103, the first inorganic film forming unit 233 forms a first inorganic film (B of FIG. 17). B of FIG. 17 shows the first microlens layer 181-1 which is formed using P-CVD. In this case, the film formation is performed under the following conditions: SiH4, NH3, N2O, and N2 are used as film formation gas if the first microlens layer 181-1 is SiON, or SiH4, NH3, and N2 are used as film formation gas if the first microlens layer 181-1 is SiN; and the film is formed by P-CVD at a temperature of about 200° C., where the pressure etc. is adjusted as appropriate.

At this time, as to the film formation technique using P-CVD, for the film formation conditions, the mean free path during the film formation is adjusted, taking the level difference of the color filters 132 into consideration, so that the level difference is reduced.

Figure 18:
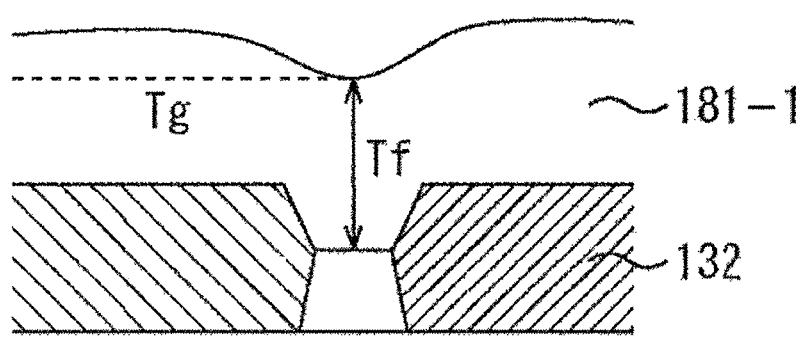
FIG. 18 is a diagram for describing an example film pressure ratio.

Silicon Nitride (SiN) Film
gas: SiH4, NH3, N2
temperature: about 200° C.
Silicon Oxynitride (SiON) Film
gas: SiH4, NH3, N2O, N2
temperature: about 200° C.
pressure: 2 mTorr to 10 Torr Here, the mean free path becomes gradually higher toward 2 mTorr and lower toward 10 Torr. Therefore, as to the planarity ($\Delta h$) after the film formation of the first microlens layer in terms of the film thickness ratio of Tf and Tg shown in FIG. 18, Tg/Tf decreases when the firm formation is performed under pressure conditions which provide a higher mean free path. As a result, the planarization film of resin can be formed to have a thin thickness as it is formed, and the first microlens can be satisfactorily formed because of a slight difference in etching selection ratio between the first microlens layer 181-1 and the planarization film of resin during dry etching in the formation of the first microlens.

In step S104, the planarization film forming unit 234 forms a planarization film (C of FIG. 17). As shown in C of FIG. 17, a middle film 401 which will be positioned between the first microlens layer 181-1 and a photoresist pattern which will be next formed, is formed on the first microlens layer 181-1. Here, the middle film 401 is formed of a material which has a larger thermal expansion coefficient than that of the photoresist.

A photoresist pattern described below is formed on and made contact with the middle film 401 having a larger thermal expansion coefficient than that of the resist, and thereafter, the resist is shaped into a lens by thermal reflow. As a result, the middle film 401 having a larger thermal expansion coefficient than that of the photoresist can reduce a force which is caused by the photoresist spreading during the thermal reflow, thereby reducing the amount of sliding of the photoresist pattern formed in contact with the middle film 401. Therefore, even if the length of the gap of the photoresist pattern is narrowed, adjacent resists are not in contact with each other, and therefore, the occurrence of a pattern collapse due to fusion can be prevented.

At this time, a film thickness 401 of the middle film is preferably 150 nm or more in a thinnest region. If the film thickness is smaller than or equal to this value, the effect which is obtained using the difference in thermal expansion coefficient cannot be obtained, and the controllability of the lens shape is likely to deteriorate.

In step S105, the resist pattern forming unit 235 forms a resist pattern (D of FIG. 17). D of FIG. 17 shows a state in which a photoresist pattern 402 is formed on the first lens layer, corresponding to each pixel of the image pickup device 100. As a positive photosensitive resin, a material based on a novolac-based resin, a styrene-based resin, or a copolymer-based resin of these resins, is used.

Also, the pattern formation is performed using spin coating, prebake, i-line exposure, post-exposure bake, or a development process.

In step S106, the thermal reflow processing unit 236 performs a thermal reflow process (E of FIG. 17). As shown E of FIG. 17, the photoresist pattern 402 is baked by a thermal treatment at a temperature which is higher than or equal to the thermal softening point. In this bake process, a lens shape is obtained as shown in E of FIG. 17.

In step S107, the etchback process unit 237 performs an etching process (F of FIG. 17). F of FIG. 17 shows a state in which a photoresist 402 having a lens shape is used as a mask to transfer the shape to the first microlens layer 181-1 by etching. As to the etching process at this time, a device, such as an ICP (Inductively Coupled Plasma) device, a CCP (Capacitively Coupled Plasma) device, a TCP (Transformer Coupled Plasma) device, a magnetron RIE (Reactive Ion Etching) device, an ECR (Electron Cyclotron Resonance) device, etc., is used as a plasma generating device, and a fluorocarbon gas-based gas, such as CF4, C4F8, etc., is used as a major component to perform the etching process while adjusting the temperature, the pressure, etc. as appropriate. At this time, as shown in F of FIG. 17 or G of FIG. 17, there is a gap between adjacent first microlens layers 181-1, and a gap shown in the b-b' cross-sectional view is larger.

In step S111, the second inorganic film forming unit 238 forms a second inorganic film (G of FIG. 17). G of FIG. 17 shows a state in which a film of SiN is formed as the second microlens layer 181-2. As a film formation gas at this time, SiH4, NH3, and N2 are used, and the film is formed by P-CVD at a temperature of about 200° C., where the pressure etc. is adjusted as appropriate. At this time, as shown in the a-a' b-b' cross-sectional views, the film is formed so that a gap between adjacent second microlens layers 181-2 is eliminated.

As to this film formation technique using P-CVD, the curvature of the microlens 133 can be adjusted by adjusting the mean free path when a SiN or SiON film is formed as the second microlens layer 181-2. The specific film formation conditions are as follows.

Silicon Nitride (SiN) Film
   gas: SiH4, NH3, N2
   temperature: about 200° C.
Silicon Oxynitride (SiON) Film
   gas: SiH4, NH3, N2O, N2
   temperature: about 200° C.
   pressure: 2 mTorr to 10 Torr The mean free path becomes gradually higher toward 2 mTorr and lower toward 10 Torr.

By adjusting the mean free path as described above, the curvature of the second microlens layer 181-2 can be adjusted with respect to the first microlens layer 181-1 having the same shape.

Figure 19:
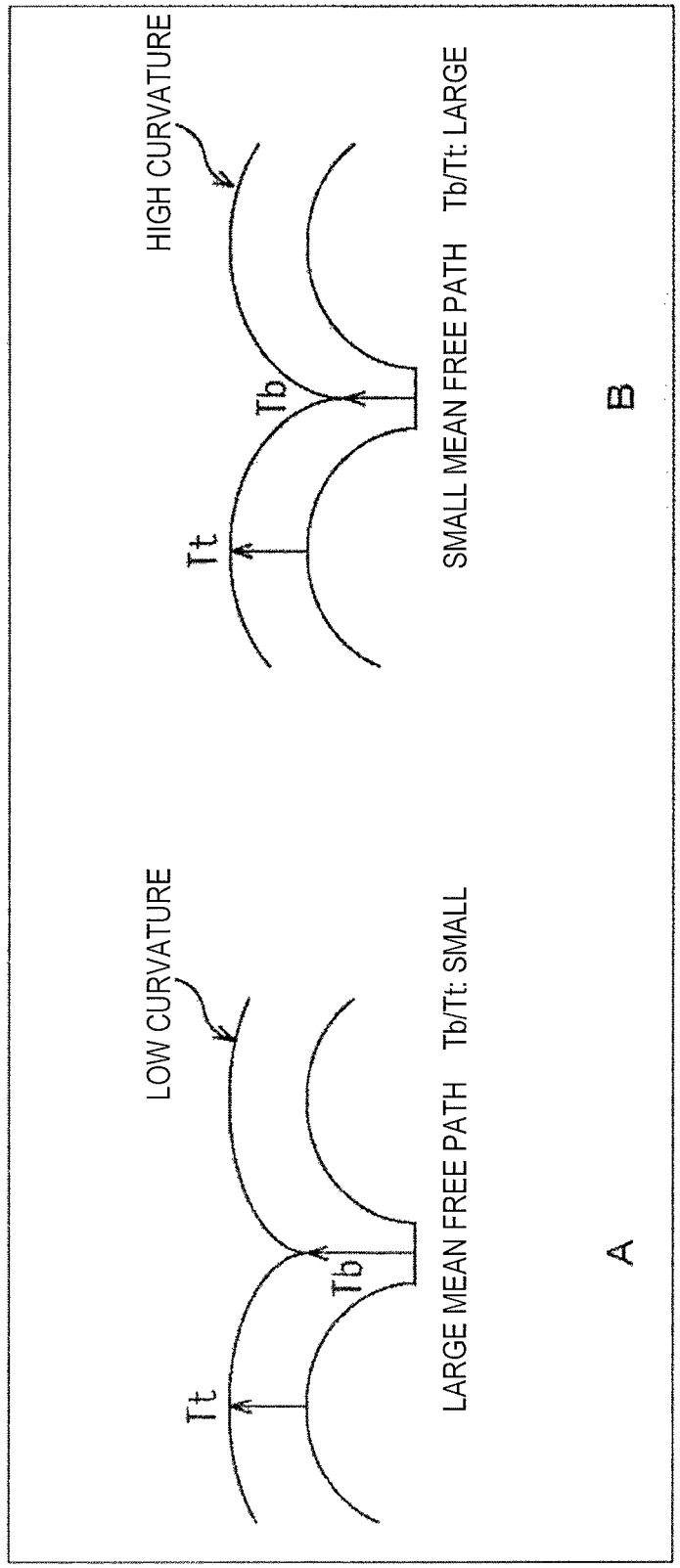
FIG. 19 is a diagram for describing an example mean free path.

For example, as shown in A of FIG. 19, when the film is formed under conditions that the mean free path is relatively large, Tb/Tt decreases and the curvature increases in the figure. As shown B of FIG. 19, when the mean free path is decreased, Tb/Tt increases and the curvature decreases. By adjusting the microlens curvature, not only microlenses which are applicable to CSP, but also microlenses which are applicable to various solid-state image pickup elements, can be formed.

Figure 20:
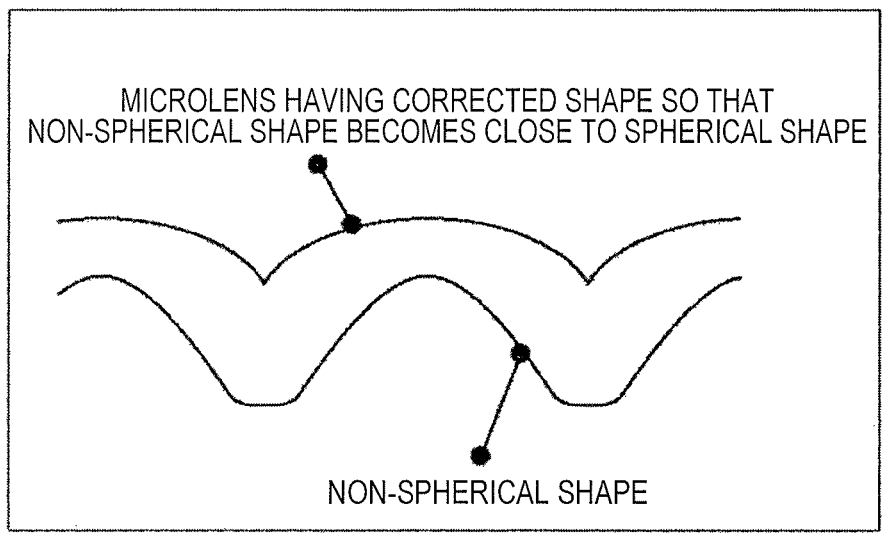
FIG. 20 is a diagram for describing example spherical surface correction.

Moreover, even when the first lens layer 181-1 has a non-curved surface shape as shown in FIG. 20, the second microlens layer 181-2 which is corrected to have a shape similar to a curved surface can be formed by adjusting the film formation conditions.

In step S112, the etchback process unit 239 performs an etching process (H of FIG. 11).

Etchback is performed on the entire second microlens layer 181-2 which has been formed so that a gap between lens layers is eliminated, in order to provide a low profile in a cross-sectional direction of the device. As to the etching process at this time, a device, such as an ICP (Inductively Coupled Plasma) device, a CCP (Capacitively Coupled Plasma) device, a TCP (Transformer Coupled Plasma) device, a magnetron RIE (Reactive Ion Etching) device, an ECR (Electron Cyclotron Resonance) device, etc., is used as a plasma generating device, and a fluorocarbon gas-based gas, such as CF4, C4F8, etc., is used as a major component, to perform the etching process while adjusting the temperature, the pressure, etc. as appropriate. Thus, by performing etchback on the front surface, the bottom position of the microlens is lowered, whereby the sensitivity characteristics of the solid-state image pickup element are improved.

When the process of step S109 ends, the manufacture process ends.

By performing the processes as described above, an image pickup element which is manufactured so that deterioration of the sensitivity characteristics is reduced can be obtained.

As described above, a manufacturing method in which the inorganic microlenses 181 are formed as the first microlens layer 181-1 and the second microlens layer 181-2 is shown. Alternatively, the first microlens layer 181-1 may be an organic microlens to which fine metal oxide particles are added.

As to a manufacturing method in which the first microlens layer 181-1 is an organic microlens, in the step of C of FIG. 17, for example, an organic microlens material may be used which employs an epoxy-based resin in which titanium oxide is added to fine metal particles. This organic microlens is formed by spin coating followed by a thermal treatment at about 150 to 200° C. In addition, the manufacturing method is optimized as appropriate, as described above.

Also, as the microlens structure of the multi-layer microlens layer 182, main film formation conditions which are used when a silicon oxide (SiO) film is used are as follows.

Silicon Oxide (SiO) Film
gas: SiH4, N2O
temperature: about 200° C.
pressure: 2 mTorr to 10 Torr Also, as a film formation method for the third microlens layer 183-3 and the fourth microlens of the multi-layer microlens layer 183 of FIG. 8, vacuum vapor deposition, sputtering, ion vapor deposition, ion beam, mist CVD (Chemical Vapor Deposition), etc. is used.

[2-3 Supplements]

Figure 21:
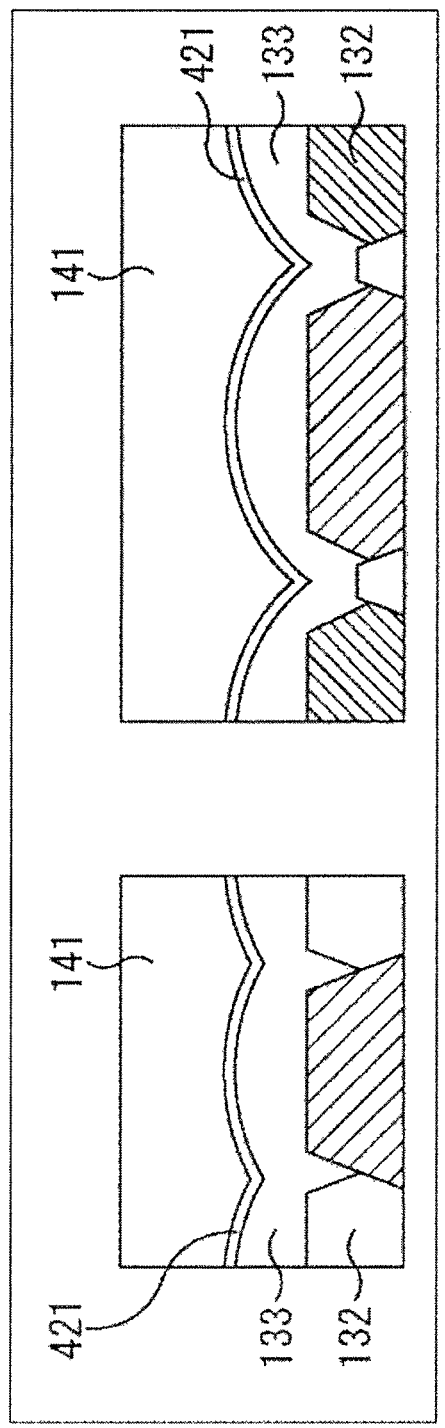
FIG. 21 is a diagram showing an example in which an anti-reflection film is applied.

FIG. 21 shows a state in which the adhesive material A 141 shown in FIG. 3 is formed on the microlens. As a material for the adhesive material A 141, an acrylic-based resin (n=1.5) or a siloxane-based resin (n=1.42 to 1.45) may be used, or in order to reduce the refractive index, fluorine may be introduced to a side chain of the resin (n=1.4 to 1.44), or hollow silica particles may be added (n=1.3 to 1.39). Also, in the figure, a SiON film having an intermediate refractive index between those of the microlens and the adhesive material is formed, whereby the interface reflection can be reduced. The reduction of the interface reflection can lead to an improvement in the sensitivity characteristics of the solid-state image pickup element, or a reduction in flare, etc.

Figure 22:
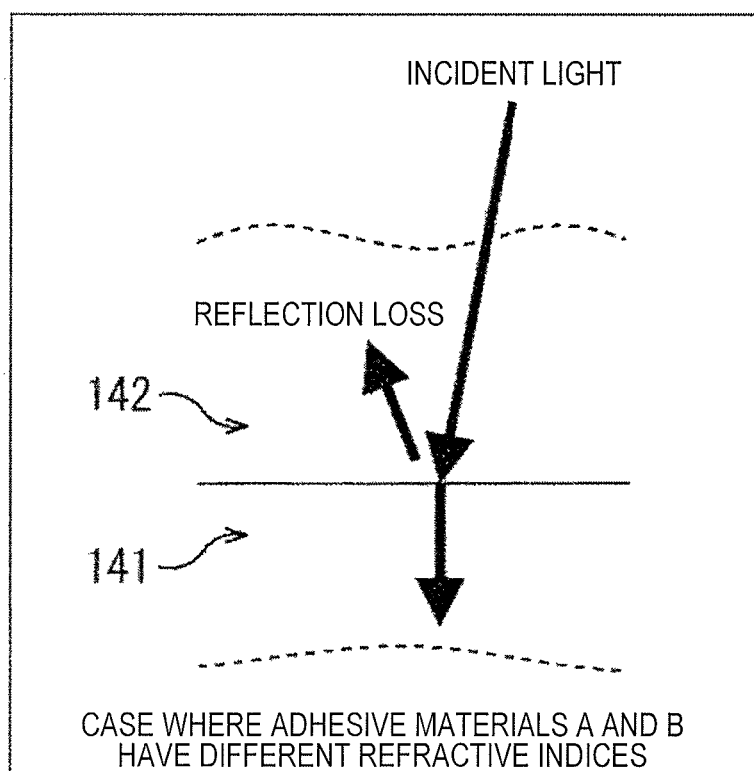
FIG. 22 is a diagram for describing an example refractive index of an adhesive agent.

Also, the adhesive material A 141 of FIG. 21 may also serve as the adhesive material B 142 of FIG. 3 (not shown). When the adhesive material A 141 also serves as the adhesive material B 142, the number of interfaces having different refractive indices is reduced, and therefore, the reflection loss of incident light decreases. As shown in FIG. 22, the decrease of the reflection loss can lead to an improvement in the sensitivity characteristics of the solid-state image pickup element, or a reduction in flare, etc.

Note that the present technology is not limited to chip size packages (CSPs). For example, a planarization film which has a lower refractive index than that of the microlens may be formed on the microlens, and a solid-state image pickup device may be packaged in a hollow form.

Also, the arrangement of the color filters 132 in the present technology is not limited to a prime color Bayer arrangement. For example, a filter having any color and arrangement, such as a complementary color filter, a white (transparent) color filter, a black color filter, etc., can be used.

Figure 23:
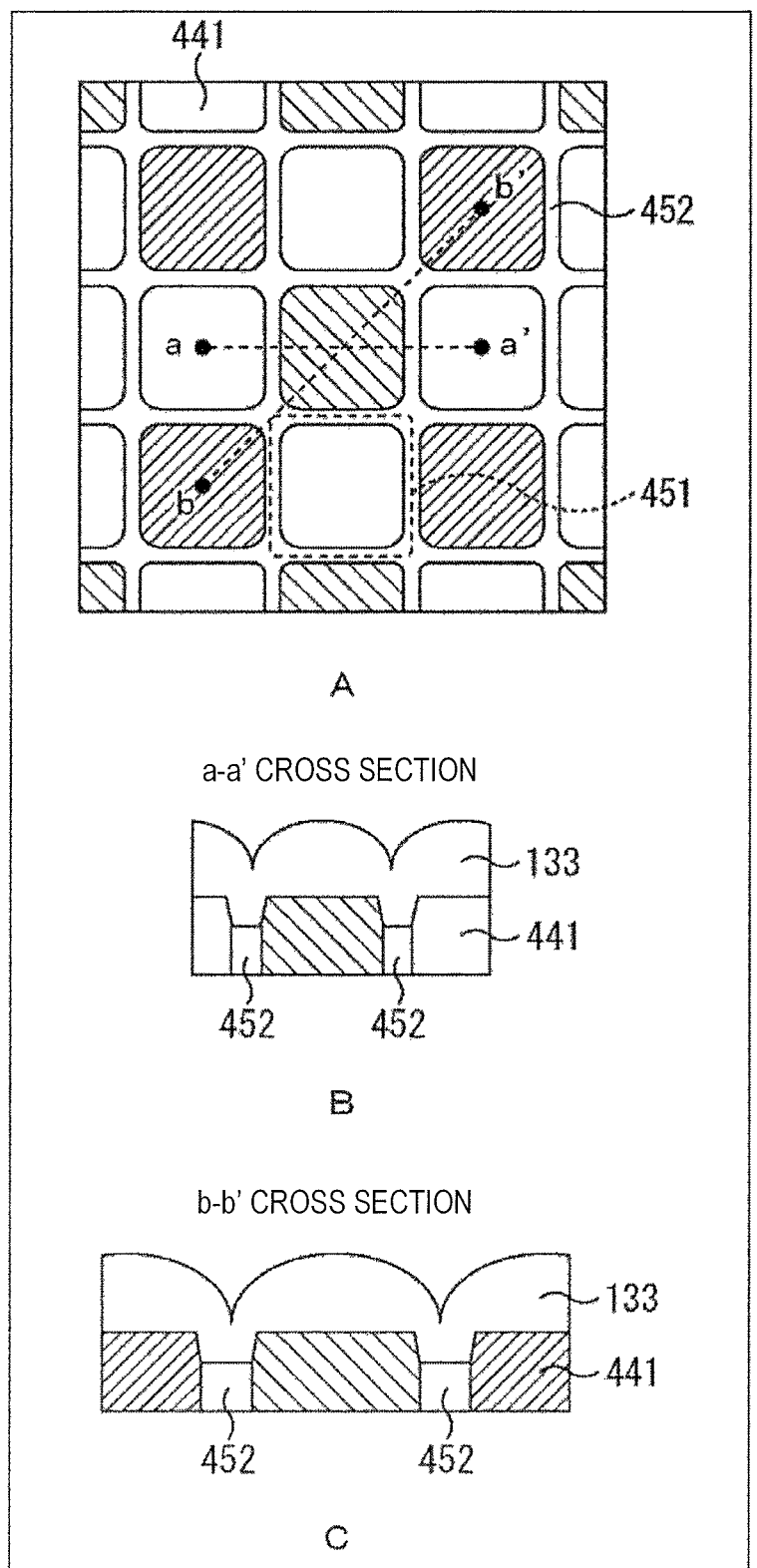
FIG. 23 is a diagram showing an example in which an inter-pixel light shield film is applied.

Also, a light shield film may be provided between pixels. For example, as shown in A of FIG. 23, an inter-pixel light shield film 452 may be provided between pixels, and a filter of each color of buried color filters 441 may be buried in a light receiving portion of each unit pixel 451. In this case, as shown in B of FIG. 23 or C of FIG. 23, projections and recesses of the light incident surface are formed by the filters and the inter-pixel light shield film 452.

Figure 24:
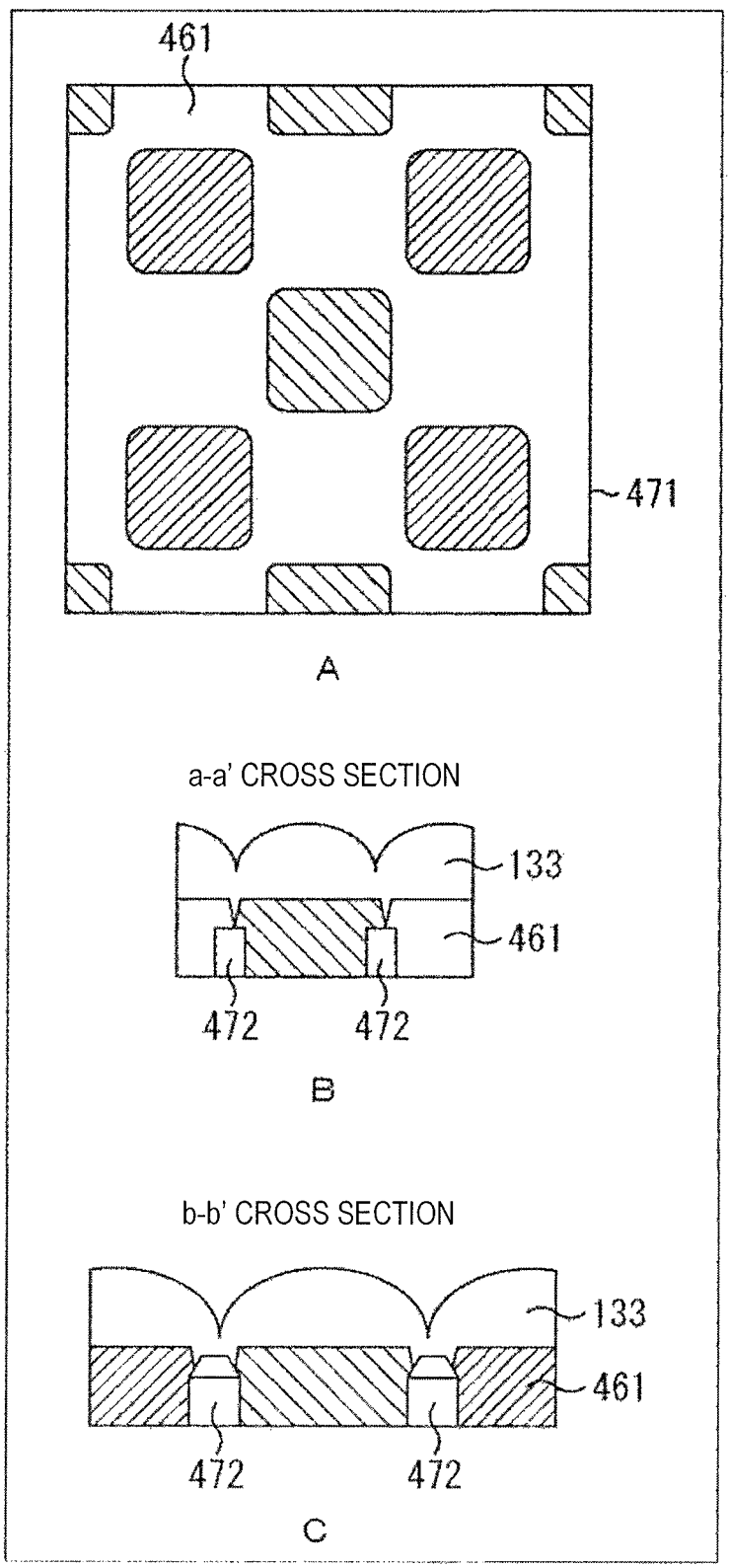
FIG. 24 is a diagram showing an example in which an inter-pixel light shield film is applied.

Also, as shown in A of FIG. 24, a buried color filter 461 may be provided on the inter-pixel light shield film. In this case, as shown in A of FIG. 24, the inter-pixel light shield film is not exposed on the light incident surface.

As shown in B of FIG. 24 and C of FIG. 24, an inter-pixel light shield film 472 is formed below the buried color filter 461. Therefore, projections and recesses of the light incident surface are formed by the buried color filter 461.

In any of the cases, similar to the foregoing, the microlens 133 can be formed.

3. Third Embodiment

[3-1 Manufacturing Device]

Note that the method for manufacturing the image pickup device is not limited to the examples described above. For example, instead of forming the non-planar film 171 which has been described with reference to FIG. 7 by coating, the non-planar layer may be formed by etching.

Figure 25:
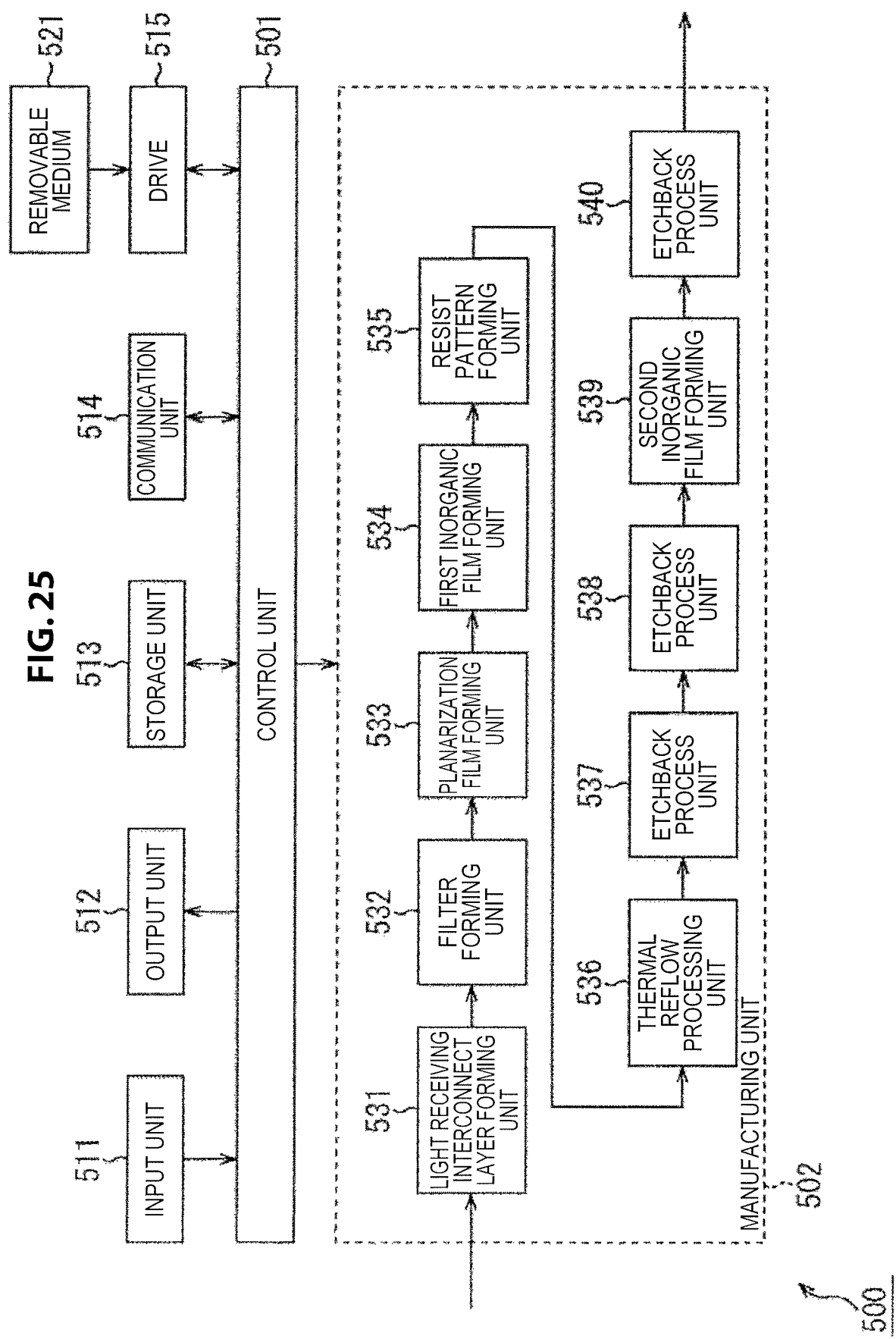
FIG. 25 is a block diagram showing another example configuration of a manufacturing device.

FIG. 25 is a block diagram showing an example main configuration of a manufacturing device in that case. A manufacturing device 500 shown in FIG. 25, which is generally similar to the manufacturing device 200, manufactures the image pickup device 100. The manufacturing device 500 has a control unit 501 and a manufacture unit 502, as with the manufacturing device 200.

The control unit 501, which is a processing unit which is similar to the control unit 201, has a CPU, a ROM, and a RAM, etc., and controls each portion of the manufacture unit 502 to perform control processes involved in manufacture of the image pickup device 100 (image pickup element).

The manufacture unit 502, which is a processing unit similar to the manufacture unit 202, is controlled by the control unit 501 to perform processes involved in manufacture of the image pickup device 100 (image pickup element). The manufacture unit 502 has a light receiving interconnect layer forming unit 531, a filter forming unit 532, a planarization film forming unit 533, a first inorganic film forming unit 534, a resist pattern forming unit 535, a thermal reflow processing unit 536, an etchback process unit 537, an etchback process unit 538, a second inorganic film forming unit 539, and an etchback process unit 540. The light receiving interconnect layer forming unit 531 to the etchback process unit 540 are controlled by the control unit 501 to perform processes of steps of manufacturing the image pickup device 100 (image pickup element) as described below.

Note that, here, for the sake of convenience, only steps involved in the present technology will be described. Actually, in order to manufacture the image pickup device 100 (image pickup element), other steps than those performed by these processing units are required. Although the manufacture unit 502 has processing units for those steps, those steps will not be described herein in detail.

The manufacturing device 500 has an input unit 511, an output unit 512, a storage unit 513, a communication unit 514, and a drive 515. The input unit 511 to the drive 515 are processing units similar to the input unit 211 to the drive 215, respectively, have similar configurations, and perform similar processes.

A removable medium 521 similar to the removable medium 221 is loaded into the drive 515 as appropriate. A computer program read from the removable medium 521 through the drive 515 is installed in the storage unit 513 as required.

[3-2 Manufacturing Method]

An example flow of the manufacture process will be described with reference to a flowchart of FIG. 26. Note that reference is made to FIG. 27 as appropriate. FIG. 27 is a diagram for describing how each step of the manufacture process is performed.

When the manufacture process begins, in step S501 the light receiving interconnect layer forming unit 531 is controlled by the control unit 201 to form a light receiving layer, an interconnect layer, etc. on an N-type semiconductor substrate supplied from the outside.

In step S502, the filter forming unit 532 forms filters (A of FIG. 27). A of FIG. 27 shows color filters 132.

In step S503, the planarization film forming unit 234 forms a planarization film 551 on the color filters 132 (B of FIG. 27). The planarization film 551 is formed of a material similar to that for the non-planar film 171, and a surface of the planarization film 551 is finally caused not to be planar, as with the non-planar film 171. Specifically, on the color filters 132, a non-planar layer having a non-planar surface, which is the planarization film 551 which has been processed, is formed. Note that, during film formation, the non-planar layer is formed as the planarization film 551 as described above.

In step S504, the first inorganic film forming unit 534 forms the first microlens layer 181-1 as a first inorganic film on the planarization film 551 (C of FIG. 27). The film formation conditions are similar to those of the second embodiment. Note that, similar to the second embodiment, the middle film 401 may be formed on the first inorganic film (the first microlens layer 181-1).

In step S505, the resist pattern forming unit 535 forms a resist pattern 402 on the first inorganic film (the first microlens layer 181-1) (D of FIG. 27).

In step S506, the thermal reflow processing unit 536 performs a thermal reflow process (E of FIG. 27). As shown in E of FIG. 27, the photoresist pattern 402 is baked by a thermal treatment at a temperature which is higher than or equal to the thermal softening point. In this bake process, a lens shape is obtained as shown in E of FIG. 27.

In step S507, the etchback process unit 537 performs an etching process (F of FIG. 27). F of FIG. 27 shows a state in which the photoresist 402 having a lens shape is used as a mask to transfer the shape to the first microlens layer 181-1 by etching. The etching process method at this time is similar to that of the second embodiment described above with reference to F of FIG. 17.

As shown by dotted line circles c and d in F of FIG. 27, the planarization film 551 is exposed by removing the first inorganic film (the first microlens layer 181-1) (e.g., SiN) at a peripheral portion of the microlens by etching. Here, by detecting C—O emission spectrum during the etching, the controllability of a position where the microlens is formed, in the height direction, can be further improved.

In step S508, the etchback process unit 538 performs an additional etching process (G of FIG. 27). Specifically, the etchback process unit 538 continues the dry etching performed in step S507. As a result, as shown by dotted line circles e or f in G of FIG. 27, level differences (projections and recesses) are formed on a surface of the planarization film 551 on the color filters (CF) 132 at the peripheral portion of the micro T lens. Specifically, projections and recesses are formed on the surface of the planarization film 551 to form a non-planar film 552.

At that time, the etchback process unit 538 may control the process time of the etching process based on a time from reference time which is time when the etchback process unit 537 detects the C—O spectrum as described above. Thus, the etchback process unit 538 can more accurately control a depth of the level differences (projections and recesses formed).

Note that, in this etching process, the etchback process unit 538 controls the process time so that projections and recesses are formed to an extent that the color filters 132 are not exposed.

In step S509, the second inorganic film forming unit 539 forms the second microlens layer 181-2 as a second inorganic film on the first inorganic film (the first microlens layer 181-1) etc. which has been dry-etched (H of FIG. 27). H of FIG. 27 shows a state in which a film of SiN is formed as the second microlens layer 181-2. The film formation conditions are similar to those of the second embodiment.

At this time, the second inorganic film (the second microlens layer 181-2) is formed so that a gap between adjacent second microlenses layers 181-2 is eliminated as shown in the a-a' b-b' cross-sectional views. As shown in the a-a' b-b' cross-sectional views, the second microlens layer 181-2 is formed to an extent that a gap between adjacent second microlens layers 181-2 is substantially eliminated. Note that a position of an upper portion of the microlens in which the second inorganic film (the second microlens layer 181-2) is formed is represented by $t_0$.

In step S510, the etchback process unit 540 perform an etching process to an extent that the first inorganic film (the first microlens layer 181-1) and the non-planar film 552 are covered by the second inorganic film (the second microlens layer 181-2), i.e., are not exposed (J of FIG. 27).

This process causes the above position $t_0$ to be $t_1$, and therefore, a low profile is achieved in a cross-sectional direction. When the low profile is achieved, characteristics of the image pickup device 100 (image pickup element) are improved.

When the process of step S510 ends, the manufacture process ends.

[3-3 Image Pickup Element]

Figure 28:
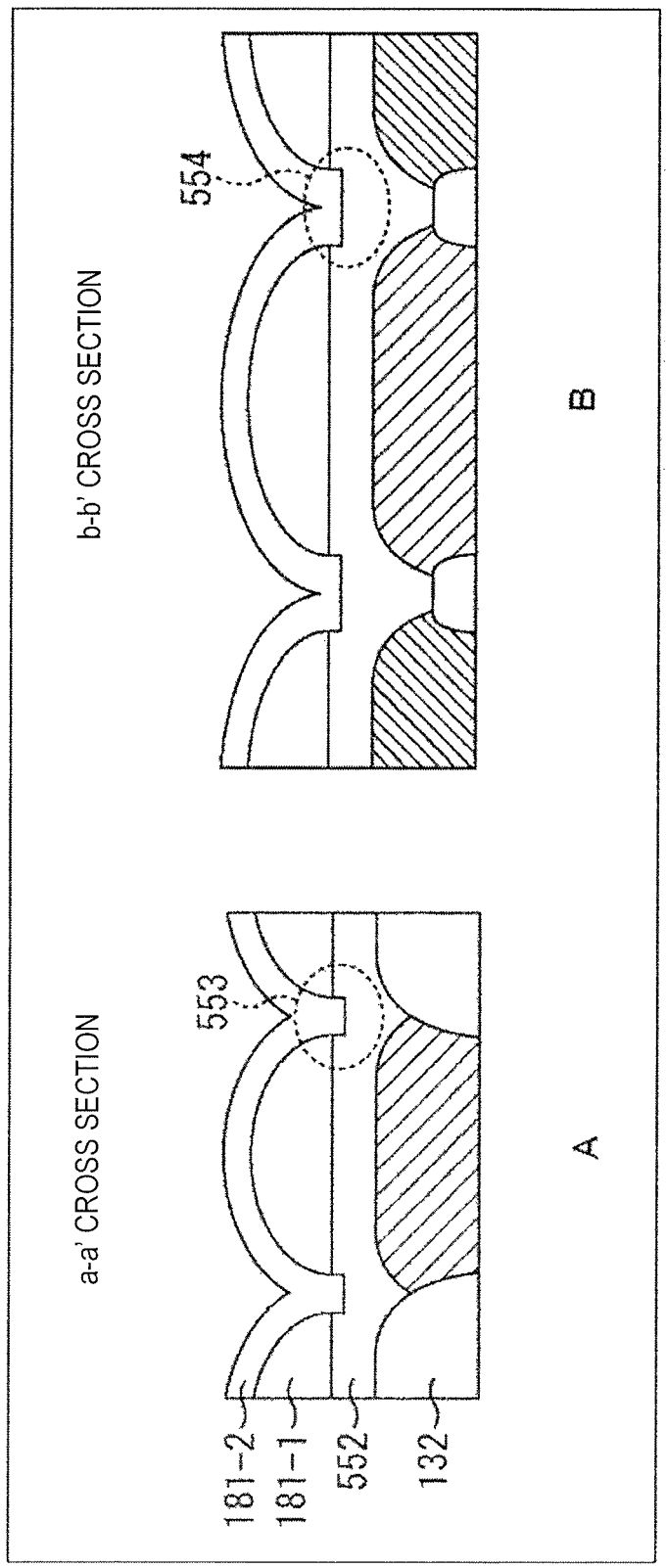
FIG. 28 is a diagram showing an example configuration of a portion of the layers of an image pickup element.

By the above manufacture process, a microlens is formed on the non-planar layer (the non-planar film 552) as shown in, for example, FIG. 28.

In this case, as shown in a dotted line circle 553 of A of FIG. 28 or in a dotted line circle 554 of B of FIG. 28, depressions (recesses) are formed on a surface of the non-planar film 552 in both the a-a' direction and the b-b' direction, and the microlens is formed with a portion (end portion) thereof being buried in the depression (recess). In other words, the microlens is formed in the depression (recess) on the surface of the non-planar film 552. The microlens of FIG. 28 includes a plurality of layers, i.e., the first microlens layer 181-1 and the second microlens layer 181-2. In the case of such a multi-layer microlens, a portion (end portion) of at least one of the layers is formed in the depression.

With such a configuration, the displacement of the microlens which is caused by a thermal treatment after the formation of the microlens, etc., can be reduced.

[3-4 Manufacturing Device]

Although, as described above, the depression (recess) on the surface of the non-planar film is formed in a peripheral portion of the microlens (pixel), it is not necessary that the depression (recess) should be formed in the entire peripheral portion, and the depression (recess) may be formed in a portion of the peripheral portion. For example, the depression (recess) may be formed only in a diagonal direction (the b-b' direction) of the pixel (i.e., only corners).

Figure 29:
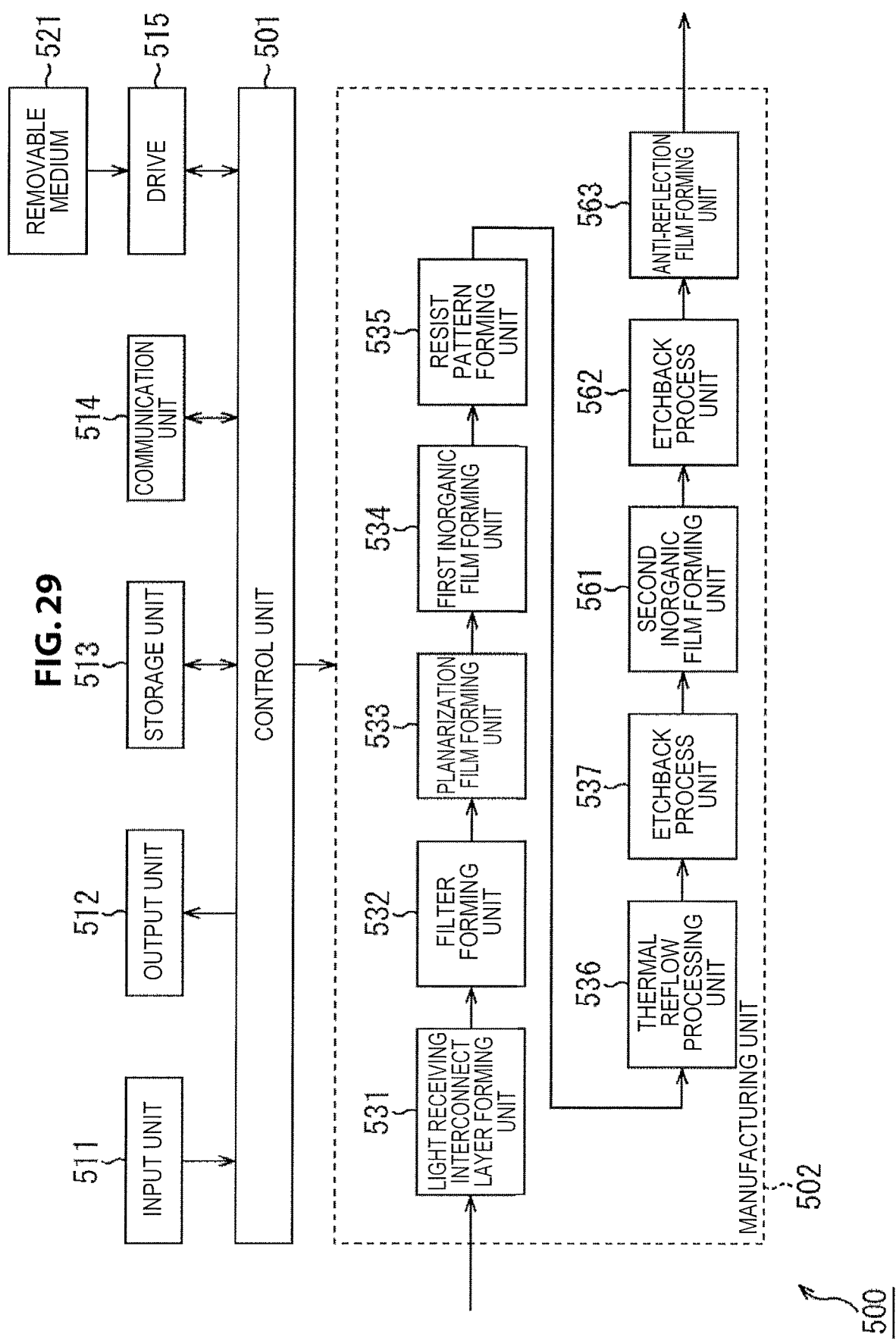
FIG. 29 is a block diagram showing still another example configuration of a manufacturing device.

FIG. 29 is a block diagram showing an example main configuration of the manufacturing device in that case. As shown in FIG. 29, in this case, the manufacture unit 502 of the manufacturing device 500 has a second inorganic film forming unit 561, an etchback process unit 562, and an anti-reflection film processing unit 563 instead of the etchback process unit 538 to the etchback process unit 540. These processing units are also controlled by the control unit 501 to perform processes of steps of manufacturing the image pickup device 100 (image pickup element) as described below.

[3-5 Manufacturing Method]

Figure 30:
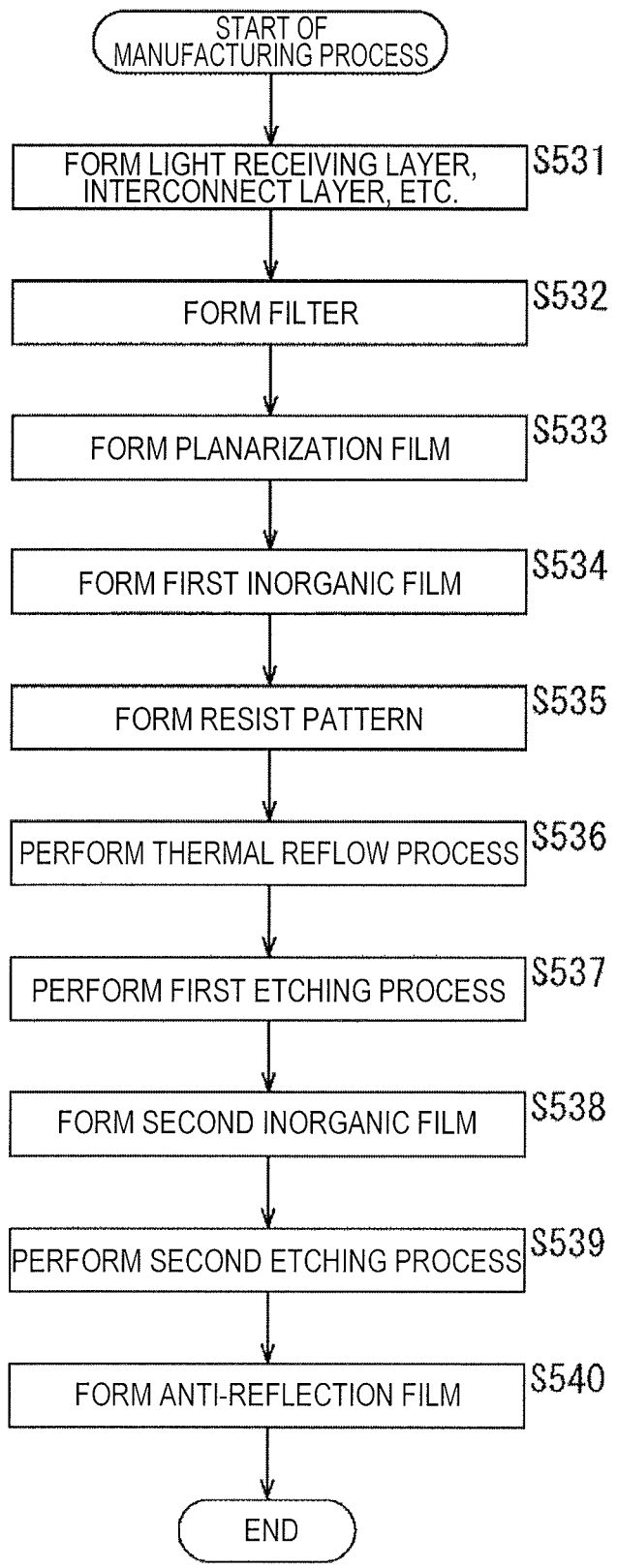
FIG. 30 is a flowchart for describing still another example flow of a manufacture process.
Figure 31:
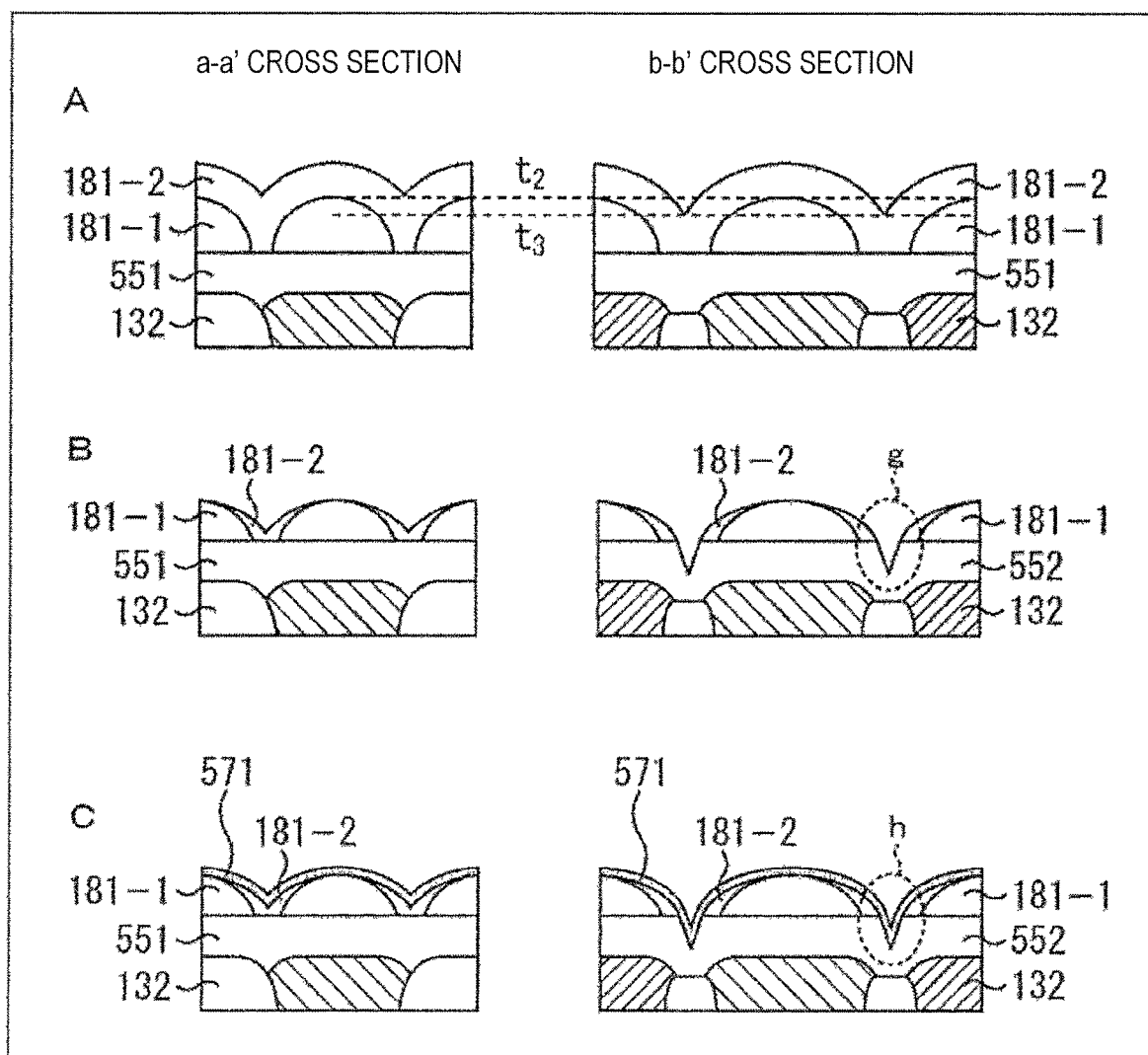
FIG. 31 is a diagram for describing still another example of how a manufacture process is performed.

An example flow of the manufacture process will be described with reference to a flowchart of FIG. 30. Note that reference is made to FIG. 31 as appropriate. FIG. 31 is a diagram for describing how each step of the manufacture process is performed.

Figure 26:
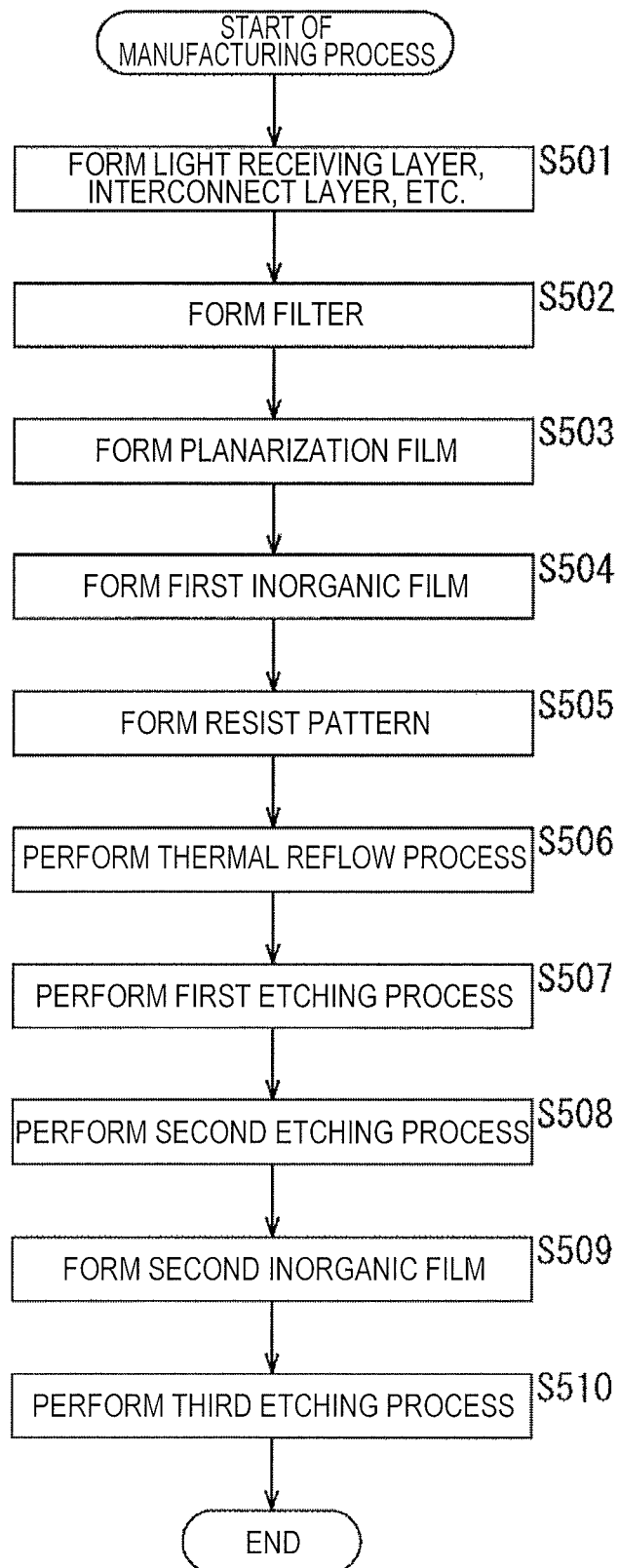
FIG. 26 is a flowchart for describing another example flow of a manufacture process.
Figure 27:
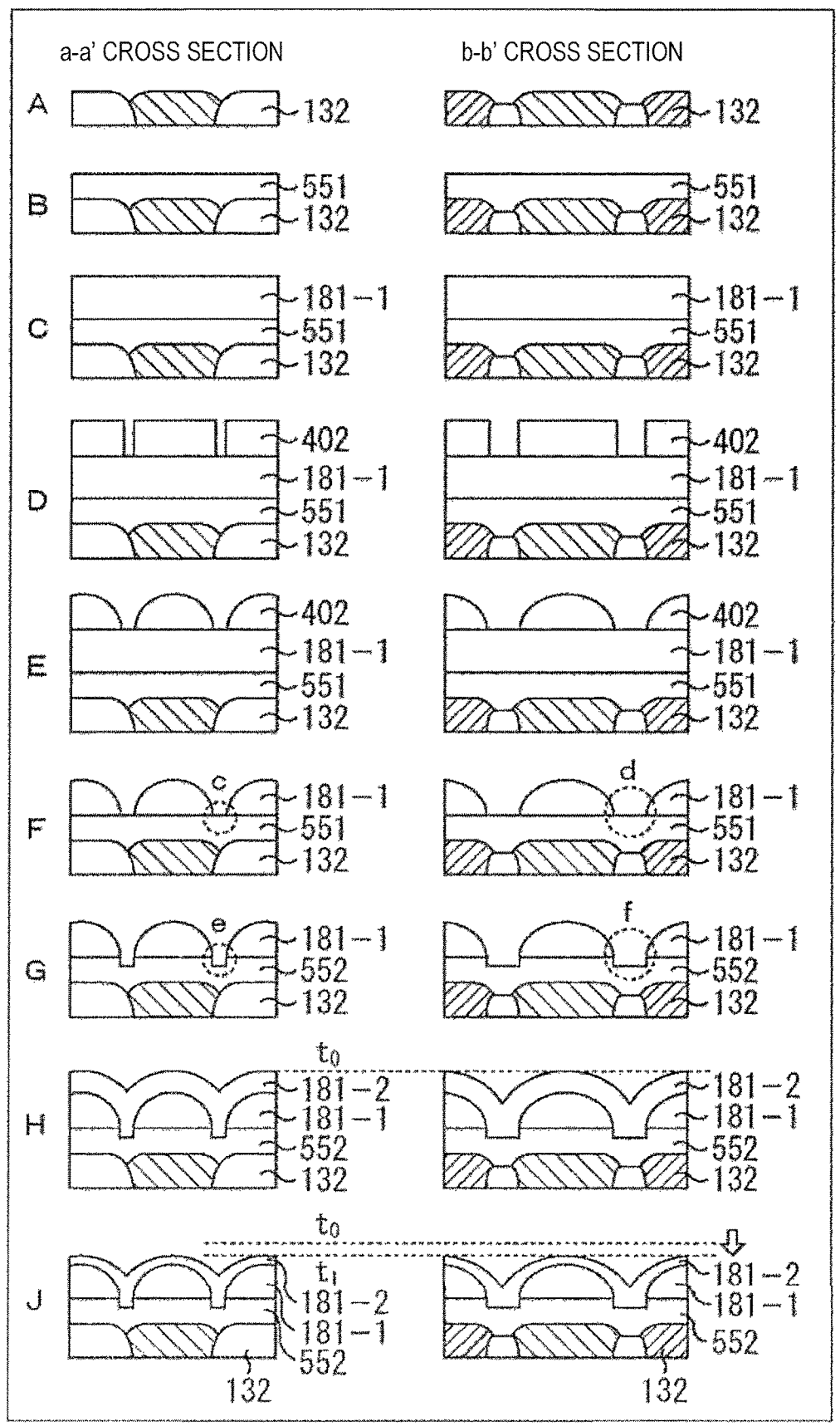
FIG. 27 is a diagram for describing another example of how a manufacture process is performed.

When the manufacture process begins, processes of step S531 to step S537 are executed in a manner similar to that of the processes of step S501 to step S507 of FIG. 26.

Note that the etchback process of step S537 ends when a C—O emission spectrum is detected. And, in step S538, the second inorganic film forming unit 561 forms a second inorganic film (the second microlens layer 181-2) to an extent that a gap of the microlens in the cross-sectional view in the a-a' direction and the b-b' direction is substantially eliminated (A of FIG. 31). By performing the film formation until a gap of the microlens is substantially eliminated, a difference in height between the a-a' direction and the b-b' direction occurs in the pixel peripheral portion. For example, as shown in A of FIG. 31, a position of an upper portion of the pixel peripheral portion in the a-a' direction is represented by $t_2$, and a position of the upper portion of the pixel peripheral portion in the b-b' direction is represented by $t_3$. In this case, the second inorganic film is formed so that the position $t_3$ of the upper portion of the four corners of the pixel (the pixel peripheral portion in the b-b' direction) is lower than the position $t_2$ of the upper portion of the pixel peripheral portion in the a-a' direction.

In step S539, the etchback process unit 562 performs an etchback process using this height difference to form local depressions (recesses) on the surface of the planarization film 551 (B of FIG. 31). As described above, the underlying organic film is reached earlier at sites corresponding to the four corners of the microlens formed at a low position with respect to the cross-sectional direction. At this time, the etching process is carried out so that level differences are formed in the organic film (the planarization film 551) at at least the sites corresponding to the four corners of the microlens.

In step S539, the anti-reflection film forming unit 563 forms an anti-reflection film 571 which is an inorganic film on a surface of each layer exposed by the etching process (dry etching) (C of FIG. 31). This inorganic film is selected from transparent materials which have a refractive index which reduces the surface reflection of the microlens made of, for example, SiN, and has an intermediate refractive index between those of the microlens material and a transparent film formed in an upper portion of the microlens material. Thus, this inorganic film has the function of resisting the displacement caused by a thermal treatment in addition to the function of preventing the surface reflection of the microlens.

When the process of step S539 ends, the manufacture process ends.

[3-6 Image Pickup Element]

Figure 32:
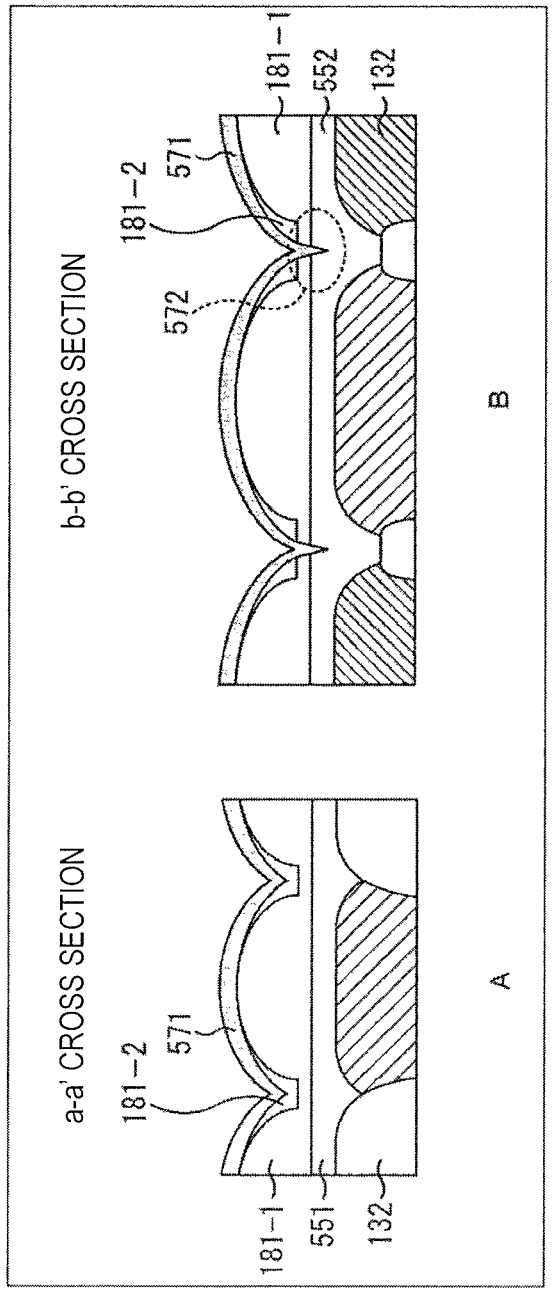
FIG. 32 is a diagram showing an example configuration of a portion of the layers of an image pickup element.

By the above manufacture process, a microlens shown in FIG. 32 is formed on the non-planar layer (the non-planar film 552), for example.

In this case, as shown in A of FIG. 32, a depression is not formed on the surface of the planarization film 551 in the a-a direction, i.e., the planarization film 551 is not changed. In contrast to this, in the b-b' direction, as shown B of FIG. 3, depressions (recesses) are formed on the surface of the planarization film 551 (a dotted line circle 572). Thus, the non-planar film 552 is formed. And, the anti-reflection film 571 is formed in the depressions (recesses).

Therefore, similar to the case of FIG. 28, the displacement of the microlens which occurs due to a thermal treatment after the formation of the microlens can be reduced. Also, as shown in FIG. 32, also in this case, a low profile is achieved in a cross-sectional direction. When a low profile is achieved, characteristics of the image pickup device 100 (image pickup element) are improved.

Note that, in a structure in a cross-sectional view of the image pickup element of each of the above examples, the microlens of inorganic film is formed without exposing organic films, such as the color filters etc., whereby damage on organic films, such as the color filters etc., which is caused by external moisture can be reduced. As a result, deterioration of spectral characteristics etc. of the image pickup element can be reduced.

[3-7 Image Pickup Element]

Figure 33:
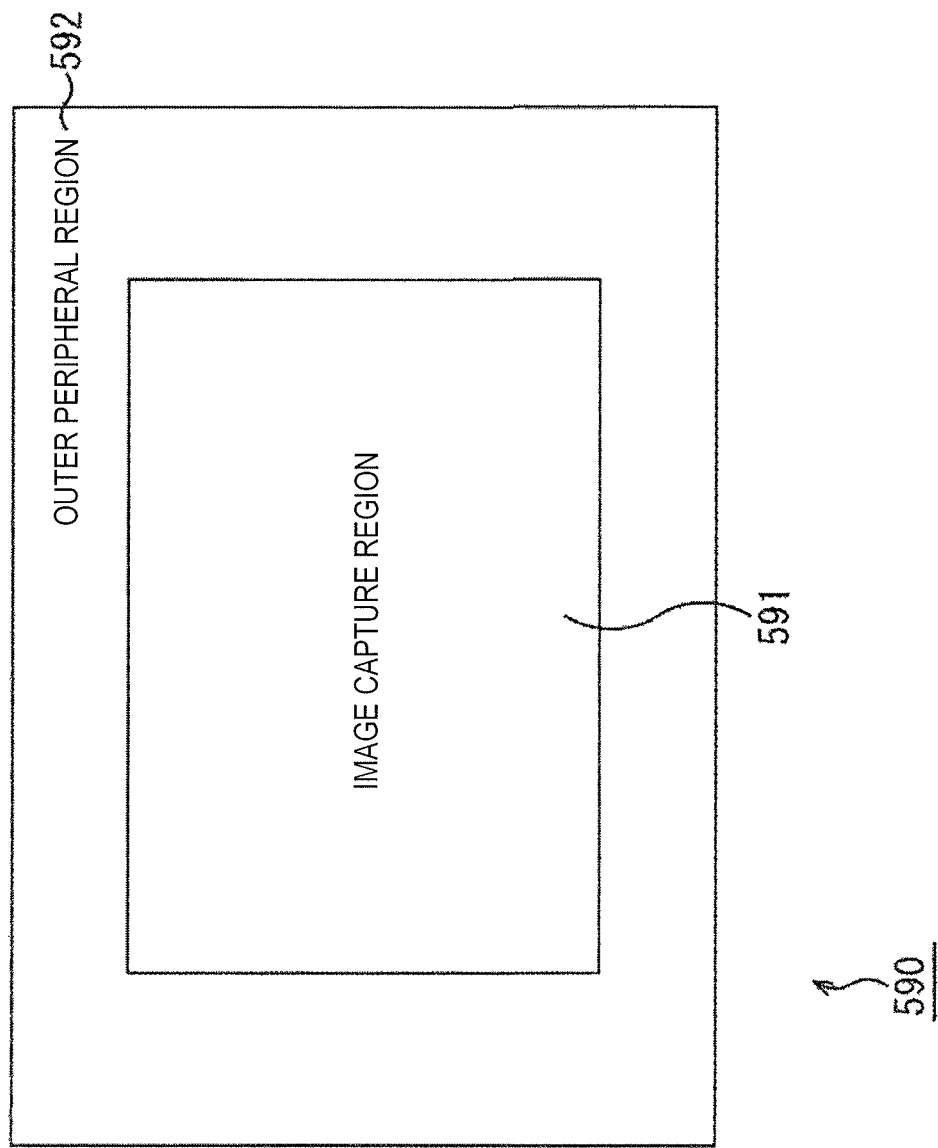
FIG. 33 is a diagram showing an example configuration of a portion of an image pickup element.

FIG. 33 is a diagram showing an example image pickup element. As shown in FIG. 33, typically, in a pixel region of the image pickup element 590 in which pixels are formed, in addition to an image capture region 591 (also referred to as an effective pixel region) which actually generates a captured image, an outer peripheral region 592 is also formed around the image capture region 591. This outer peripheral region 592 is, for example, used as a margin for reducing variations in process, or alternatively, a light shield film which is used as an OPB region is formed in the outer peripheral region 592. The pixels of the outer peripheral region 592 have a configuration generally similar to those of the image capture region 591.

In the pixel region of the image pickup element 590 thus configured, not only the pixels of the image capture region 591, but also the pixels of the outer peripheral region 592, may be configured so that the microlens of an inorganic material is formed on the non-planar layer as described above. Thus, the microlens is formed on the non-planar layer over a wider range, and therefore, the displacement of the microlens which occurs due to a thermal treatment etc. can be further reduced.

Also, in that case, the pixels of the image capture region 591 and the pixels of the outer peripheral region 592 can be formed together by a common process. As a result, the increase in time and effort of the manufacture process can be reduced, and the increase in cost can be reduced.

Note that, the above configuration in which the microlens of an inorganic material is provided on the non-planar layer may, for example, be provided only in a portion of the pixels, such as one row per several rows or one pixel per several pixels. The proportion may or may not be uniform over the entire pixel region. For example, only pixels in the outer peripheral region may have such a configuration.

4. Fourth Embodiment

[Image Pickup Device]

Figure 34:
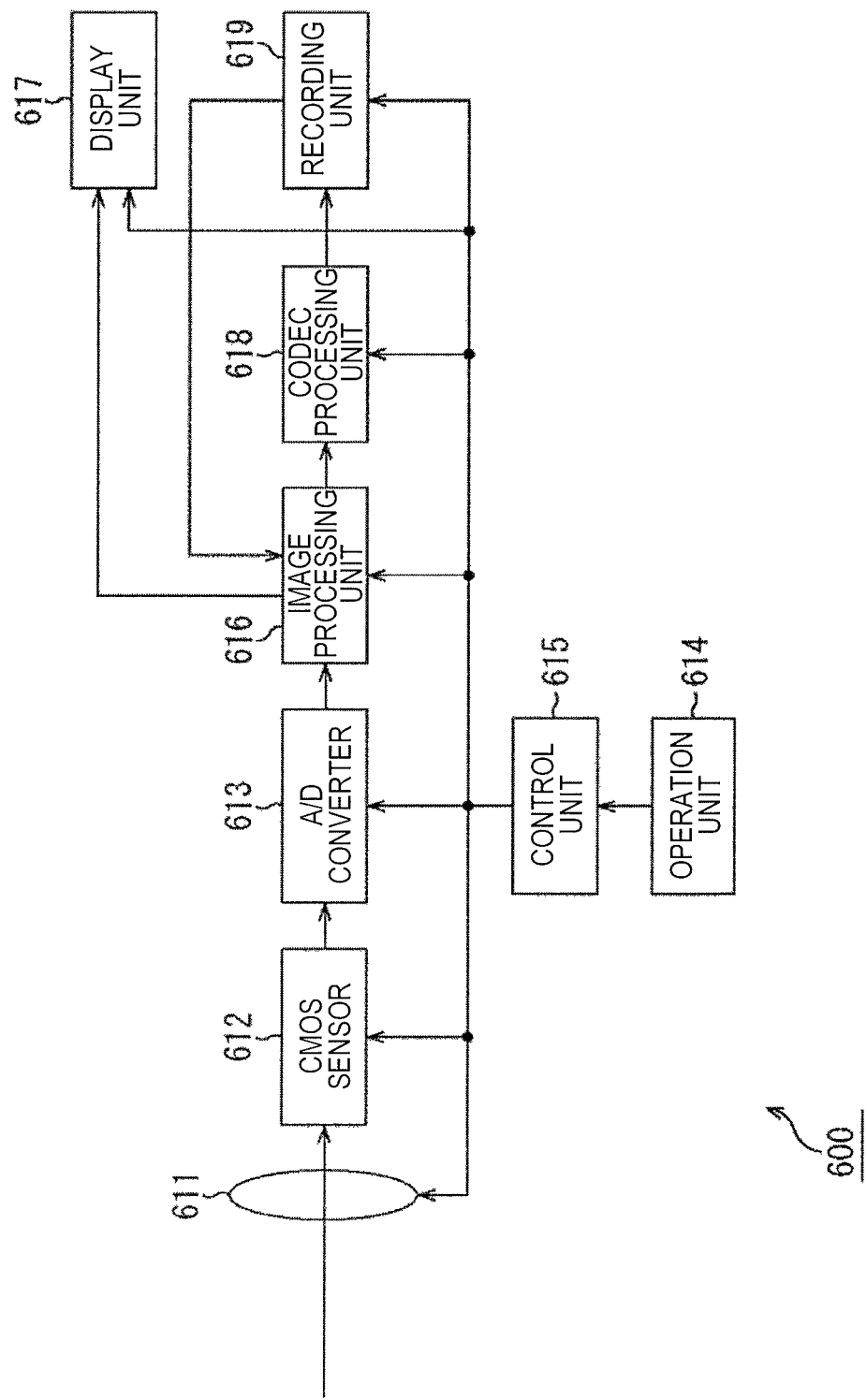
FIG. 34 is a block diagram showing an example main configuration of an image pickup device.

FIG. 34 is a block diagram showing an example main configuration of an image pickup device. The image pickup device 600 shown in FIG. 34 is a device which captures an image of an object, and outputs the image of the object as an electrical signal.

As shown in FIG. 34, the image pickup device 600 has an optical unit 611, a CMOS sensor 612, an A/D converter 613, an operation unit 614, a control unit 615, an image processing unit 616, a display unit 617, a codec processing unit 618, and a recording unit 619.

The optical unit 611 includes a lens which adjusts a focal point to an object and collects light from an in-focus position, a diaphragm which adjusts exposure, and a shutter which controls timing of image capture, etc. The optical unit 611 allows light (incident light) from an object to pass therethrough, and supplies the light to the CMOS sensor 612.

The CMOS sensor 612 perform photoelectric conversion on incident light, and supplies a signal (pixel signal) of each pixel to the A/D converter 613.

The A/D converter 613 converts the pixel signal supplied from the CMOS sensor 612 with predetermined timing into digital data (image data), and supplies the digital data sequentially to the image processing unit 616 with predetermined timing.

The operation unit 614, which includes, for example, a jog dial (trademark), a key, a button, or a touch panel etc., receives an operational input by the user, and supplies a signal corresponding to the operational input to the control unit 615.

The control unit 615 controls drive of the optical unit 611, the CMOS sensor 612, the A/D converter 613, the image processing unit 616, the display unit 617, the codec processing unit 618, and the recording unit 619 based on a signal corresponding to an operational input of the user input from the operation unit 614, to cause each unit to perform a process involved in image capture.

The image processing unit 616 performs various image processes, such as, for example, color mixture correction, black level correction, white balance adjustment, demosaicing, matrix processing, gamma correction, and YC conversion, etc., on image data supplied from the A/D converter 613. The image processing unit 616 supplies the image data on which image processing has been performed, to the display unit 617 and the codec processing unit 618.

The display unit 617, which is configured as, for example, a liquid crystal display etc., displays an image of an object based on the image data supplied from the image processing unit 616.

The codec processing unit 618 performs a predetermined encoding process on the image data supplied from the image processing unit 616, and supplies the resultant encoded data to the recording unit 619.

The recording unit 619 records the encoded data from the codec processing unit 618. The encoded data recorded in the recording unit 619 is read out into and decoded by the image processing unit 616 as required. The image data obtained by the decoding process is supplied to the display unit 617, which displays the corresponding image.

The present technology described above is applied to the CMOS sensor 612 of the above image pickup device 600. Specifically, the above image pickup device 100 is used in the CMOS sensor 612. Therefore, the CMOS sensor 612 can reduce deterioration of the sensitivity characteristics. Therefore, the image pickup device 600 can capture an image of an object, thereby obtaining an image having higher image quality.

Note that the image pickup device to which the present technology is applied is not limited to the above configuration, and may have other configurations. In addition to, for example, a digital still camera and a camcorder, the image quality device may be an information processing device having the function of capturing an image, such as a mobile telephone, a smartphone, a tablet device, a personal computer, etc. Also, the image pickup device may be a camera module which is attached to another information processing device in use (or loaded as an embedded device).

5. Fifth Embodiment

<Computer>

The above mentioned series of processes can, for example, be executed by hardware, or can be executed by software. In the case where the series of processes is executed by software, a program configuring this software is installed in a computer via a network of from a recording medium.

The storage medium includes, as shown in FIG. 15, FIG. 25, and FIG. 29, for example, the removable medium 221 and the removable medium 521 storing the program, which is distributed for delivering the program to a user independently from the apparatus. The removable medium 221 and the removable medium 521 include a magnetic disk (including flexible disk) and an optical disk (including CD-ROM and DVD), and further includes a magneto optical disk (including MD (Mini Disc)), a semiconductor memory and the like. Alternatively, besides the removable medium 221 or the removable medium 521, the above-described storage medium may include ROM that stores the program, which is distributed to the user in the form of being preliminarily installed in the apparatus, and a hard disk included in the storage part 213.

The expression "computer" includes a computer in which dedicated hardware is incorporated and a general-purpose personal computer or the like that is capable of executing various functions when various programs are installed.

Figure 35:
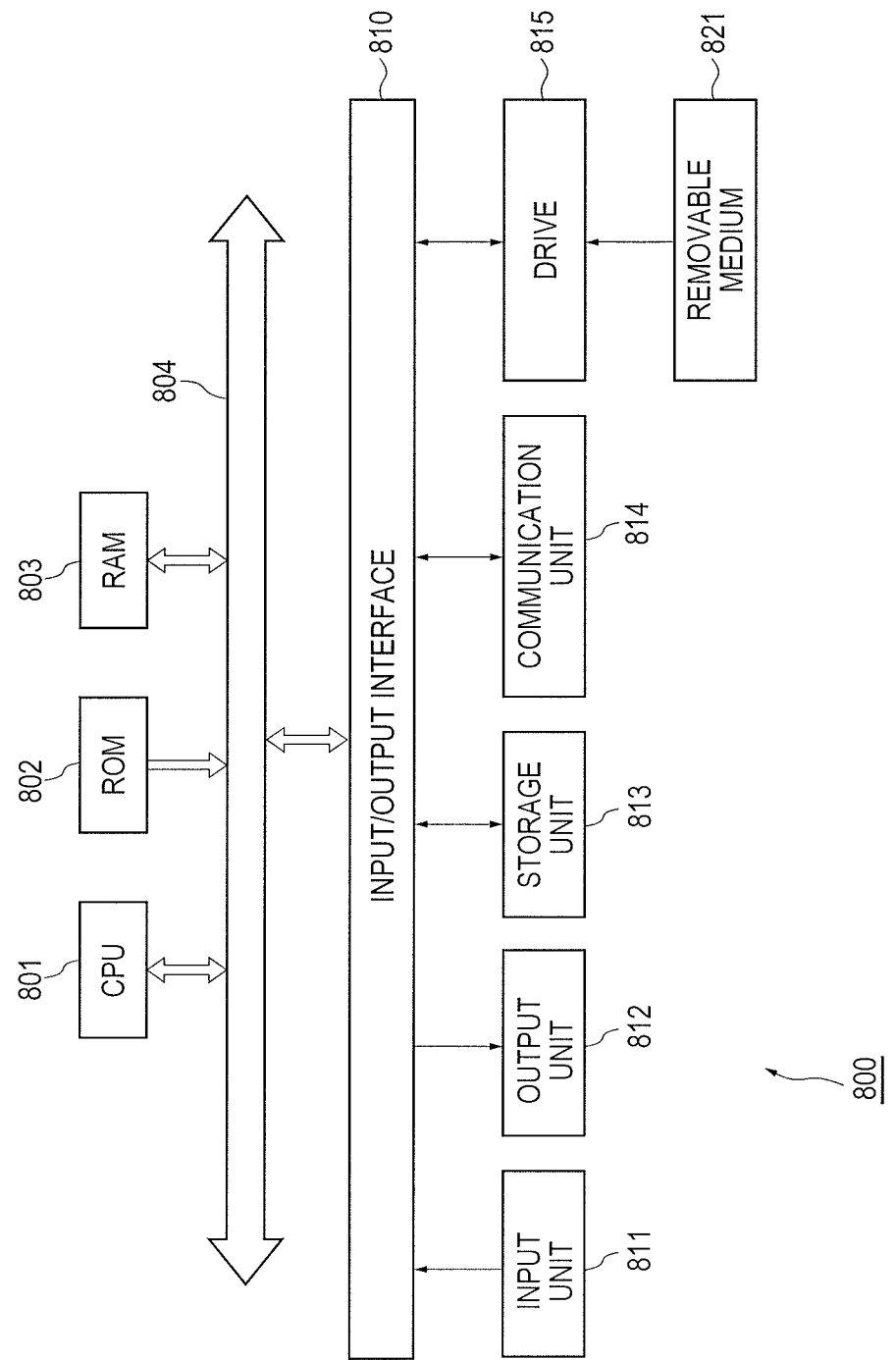
FIG. 35 is a block diagram showing an example main configuration of a computer.

FIG. 35 is a block diagram showing an example configuration of the hardware of a computer that executes the series of processes described earlier according to a program.

In the computer 800 shown in FIG. 35, a central processing unit (CPU) 801, a read only memory (ROM) 802 and a random access memory (RAM) 803 are mutually connected by a bus 804.

An input/output interface 810 is also connected to the bus 804. An input unit 811, an output unit 812, a storage unit 831, a communication unit 814, and a drive 815 are connected to the input/output interface 810.

The input unit 811 is configured from a keyboard, a mouse, a microphone, a touch panel, an input terminal or the like. The output unit 812 is configured from a display, a speaker, an output terminal or the like. The storage unit 813 is configured from a hard disk, a RAM disk, a non-volatile memory or the like. The communication unit 814 is configured from a network interface or the like. The drive 815 drives a removable medium 821 such as a magnetic disk, an optical disk, a magneto-optical disk, a semiconductor memory or the like.

In the computer 800 configured as described above, the CPU 801 loads a program that is stored, for example, in the storage unit 813 onto the RAM 803 via the input/output interface 810 and the bus 804, and execute the program. Thus, the above-described series of processing is performed. The RAM 803 stores data in a suitable manner, which is necessary for the CPU 801 to execute various processing.

Programs to be executed by the computer (the CPU 801) are applied being recorded in the removable medium 821 which is a packaged medium or the like. Also, programs may be provided via a wired or wireless transmission medium, such as a local area network, the Internet or digital satellite broadcasting.

In the computer, by loading the removable medium 821 into the drive 815, the program can be installed into the storage unit 831 via the input/output interface 810. It is also possible to receive the program from a wired or wireless transfer medium using the communication unit 814 and install the program into the storage unit 813. As another alternative, the program can be installed in advance into the ROM 802 or the storage unit 813.

Note that the program executed by the computer may be a program in which processes are carried out in a time series in the order described in this specification or may be a program in which processes are carried out in parallel or at necessary timing, such as when the processes are called.

Note that, in this specification, steps that write the program to be recorded in the recording medium do not necessarily have to be performed in time series in line with the order of the steps, and instead may include processing that is performed in parallel or individually.

Further, in the present disclosure, a system has the meaning of a set of a plurality of configured elements (such as an apparatus or a module (part)), and does not take into account whether or not all the configured elements are in the same casing. Therefore, the system may be either a plurality of apparatuses, stored in separate casings and connected through a network, or a plurality of modules within a single casing.

Further, an element described as a single device (or processing unit) above may be divided to be configured as a plurality of devices (or processing units). On the contrary, elements described as a plurality of devices (or processing units) above may be configured collectively as a single device (or processing unit). Further, an element other than those described above may be added to each device (or processing unit). Furthermore, a part of an element of a given device (or processing unit) may be included in an element of another device (or another processing unit) as long as the configuration or operation of the system as a whole is substantially the same.

It should be noted that the program executed by a computer may be a program that is processed in time series according to the sequence described in this specification or a program that is processed in parallel or at necessary timing such as upon calling.

For example, the present disclosure can adopt a configuration of cloud computing which processes by allocating and connecting one function by a plurality of apparatuses through a network.

Further, each step described by the above mentioned flow charts can be executed by one apparatus or by allocating a plurality of apparatuses.

In addition, in the case where a plurality of processes is included in one step, the plurality of processes included in this one step can be executed by one apparatus or by allocating a plurality of apparatuses.

Additionally, the present technology may also be configured as below.

(1)
An image pickup element including:
a non-planar layer having a non-planar light incident surface in a light receiving region; and
a microlens of an inorganic material which is provided on a side of the light incident surface of the non-planar layer, and collects incident light.

(2)
The image pickup element according to (1), wherein the microlens includes a plurality of layers.

(3)
The image pickup element according to (2), wherein the layers of the microlens including the plurality of layers have different refractive indices.

(4)
The image pickup element according to (2) or (3), wherein
the layers of the microlens including the plurality of layers have different curved surface shapes.

(5)
The image pickup element according to any one of (2) to (4), wherein
at least a portion of the layers of the microlens including the plurality of layers is formed in a recess portion of the non-planar layer.

(6)
The image pickup element according to any one of (1) to (5), wherein
an anti-reflection film is formed over a light incident surface of the microlens.

(7)
The image pickup element according to any one of (1) to (6), further including:
an adhesive material layer provided on a side of a light incident surface of the microlens.

(8)
The image pickup element according to any one of (1) to (7), wherein
the non-planar layer has a filter.

(9)
The image pickup element according to (8), wherein
the filter includes filters with a plurality of colors having different thicknesses in a direction in which light passes.

(10)
The image pickup element according to (9), wherein
in the filter, filters having different thicknesses and corresponding to red, green, and blue pixels, are arranged in a Bayer arrangement, and the green filters are linked between pixels.

(11)
The image pickup element according to any one of (8) to (10), wherein
the filter is formed of an organic material.

(12)
The image pickup element according to any one of (8) to (11), wherein
the non-planar layer has an organic film which is formed on the filter and has a non-planar light incident surface.

(13)
The image pickup element according to (12), wherein
heights of projections and recesses of a light incident surface of the organic film are lower than heights of projections and recesses of a light incident surface of the filter.

(14)
The image pickup element according to (12) or (13), wherein
the refractive index of the organic film is between the refractive index of the filter and the refractive index of the microlens.

(15)
The image pickup element according to any one of (8) to (14), wherein
the non-planar layer has an inter-pixel light shield film.

(16)
The image pickup element according to (15), wherein
the non-planar layer has projections and recesses on the light incident surface due to a difference in height between the filter and the inter-pixel light shield film.

(17)

The image pickup element according to any one of (1) to (16), wherein a chip size package structure is formed.

(18)

An image pickup device including:
an image pickup element which captures an image of an object, and outputs the image of the object as an electrical signal; and
an image processing unit which processes the image of the object obtained by the image pickup element,
wherein the image pickup element includes
 a non-planar layer which has a non-planar light incident surface in a light receiving region, and
 a microlens of an inorganic material which is provided on a side of the light incident surface of the non-planar layer, and collects incident light.

(19)

A manufacturing device including:
a non-planar layer forming unit which forms a non-planar layer having a non-planar light incident surface in a light receiving region of an image pickup element;
an inorganic film forming unit which forms an inorganic film on a side of the light incident surface of the non-planar layer formed by the non-planar layer forming unit;
a planarization film forming unit which forms a planarization film on a side of a light incident surface of the inorganic film formed by the inorganic film forming unit;
a resist forming unit which forms a resist on a side of a light incident surface of the planarization film formed by the planarization film forming unit;
a thermal reflow process unit which performs a thermal reflow process on the image pickup element on which the resist has been formed by the resist forming unit; and
an etching process unit which performs etching on the image pickup element on which the thermal reflow process has been performed by the thermal reflow process unit.

(20)

A method for manufacturing a manufacturing device which manufactures an image pickup element, the method including:
by the manufacturing device,
 forming a non-planar layer having a non-planar light incident surface in a light receiving region of an image pickup element,
 forming an inorganic film on a side of the light incident surface of the non-planar layer formed,
 forming a planarization film on a side of a light incident surface of the inorganic film formed,
 forming a resist on a side of a light incident surface of the planarization film formed,
 performing a thermal reflow process on the image pickup element on which the resist has been formed, and
 performing etching on the image pickup element on which the thermal reflow process has been performed.

REFERENCE SIGNS LIST 100 image pickup device
121 image pickup region
132 color filter
133 microlens
171 non-planar film
200 manufacturing device
202 manufacture unit
231 light receiving interconnect layer forming unit
232 filter forming unit
233 first inorganic film forming unit
234 planarization film forming unit
235 resist pattern forming unit
236 thermal reflow process unit
237 etchback process unit
421 anti-reflection film
441 buried color filter
452 inter-pixel light shield film

The invention claimed is:

1. A light detecting device comprising:
a non-planar layer; and
a microlens layer disposed above the non-planar layer,
wherein a thickness from a bottom surface of the non-planar layer to a bottom surface of the microlens layer in a side direction of the non-planar layer is larger than a thickness from a bottom surface of the non-planar layer to a bottom surface of the microlens layer in a diagonal direction of the non-planar layer.

2. The light detecting device according to claim 1, wherein the non-planar layer comprises a color filter layer.

3. The light detecting device according to claim 2, wherein the color filter layer is in contact with the microlens layer.

4. The light detecting device according to claim 2, wherein the non-planar layer comprises an organic film disposed between the color filter layer and the microlens layer.

5. The light detecting device according to claim 4, wherein the organic film is in contact with color filter layer and the microlens layer.

6. The light detecting device according to claim 2, wherein the color filter layer is between a photodiode and the non-planar layer.

7. The light detecting device according to claim 6, wherein the color filter layer includes filters with a plurality of colors having different thicknesses in a direction in which the light passes.

8. The light detecting device according to claim 2, wherein the filter is an organic material.

9. The light detecting device according to claim 1, wherein no planarization layer is disposed between the microlens layer and the non-planar layer.

10. The light detecting device according to claim 1, wherein the microlens layer comprises an inorganic material.

11. The light detecting device according to claim 1, further comprising:
an adhesive layer disposed above the microlens layer; and
a glass layer disposed above the adhesive layer.

12. The light detecting device according to claim 11, wherein the adhesive layer is in contact with the microlens layer and the glass layer.

13. The light detecting device according to claim 1, wherein light is transmissible through the microlens layer, and a curved surface of the microlens layer is configured to guide the light onto the non-planar layer.

14. The light detecting device according to claim 13, wherein the light is transmissible through the non-planar layer.

15. The light detecting device according to claim 1, wherein the non-planar layer is made of SiON.

16. The light detecting device according to claim 1, wherein the non-planar layer is an inorganic material.

17. The light detecting device according to claim 1, wherein the non-planar layer is an organic material.

* * * * *